(12) United States Patent
Komatsu et al.

(10) Patent No.: US 9,587,065 B2
(45) Date of Patent: Mar. 7, 2017

(54) COMPOSITION FOR PATTERN FORMATION, AND PATTERN-FORMING METHOD

(71) Applicant: JSR CORPORATION, Tokyo (JP)

(72) Inventors: Hiroyuki Komatsu, Tokyo (JP);
Shinya Minegishi, Tokyo (JP);
Takehiko Naruoka, Tokyo (JP);
Tomoki Nagai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/702,139

(22) Filed: May 1, 2015

(65) Prior Publication Data

US 2015/0323870 A1 Nov. 12, 2015

(30) Foreign Application Priority Data

May 8, 2014 (JP) ................................ 2014-097238

(51) Int. Cl.
*C08F 297/02* (2006.01)
*C08F 293/00* (2006.01)
(Continued)

(52) U.S. Cl.
CPC ........ *C08F 297/026* (2013.01); *C08F 293/00* (2013.01); *C08L 53/00* (2013.01);
(Continued)

(58) Field of Classification Search
CPC ... G03F 7/002; G03F 7/20; G03F 7/40; G03F 7/168; H01L 21/0274; C08F 293/00; C08L 53/00
(Continued)

(56) References Cited

U.S. PATENT DOCUMENTS

2014/0238956 A1* 8/2014 Namie ................ H01L 21/0337
216/83
2015/0093508 A1* 4/2015 Nagai .................... B82Y 40/00
427/271
2015/0277223 A1* 10/2015 Komatsu ............. H01L 21/0274
430/285.1

FOREIGN PATENT DOCUMENTS

JP 2003-218383 A 7/2003
JP 2008-149447 A 7/2008
(Continued)

OTHER PUBLICATIONS

U.S. Appl. No. 14/638,610, filed Mar. 4, 2015, Komatsu, et al.
U.S. Appl. No. 14/638,521, filed Mar. 4, 2015, Komatsu, et al.

*Primary Examiner* — Amanda C Walke
(74) *Attorney, Agent, or Firm* — Oblon, McClelland, Maier & Neustadt, L.L.P.

(57) ABSTRACT

A composition for pattern formation includes a block copolymer. The block polymer includes a first labile group at an end of a main chain of the block copolymer. The first acid liable group is capable of being dissociated by an acid or heat. The composition preferably further contains an acid generator that generates an acid upon application of an energy. The block copolymer is preferably capable of forming a phase separation structure through directed self-assembly. The first labile group is preferably represented by formula (a). R represents a monovalent organic group having 1 to 20 carbon atoms; R' represents a hydrogen atom or a monovalent organic group having 1 to 20 carbon atoms; and * denotes a binding site to an atom at the end of the main chain of the block copolymer.

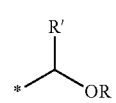

(a)

19 Claims, 6 Drawing Sheets

(51) Int. Cl.
*G03F 7/16* (2006.01)
*C08L 53/00* (2006.01)
*G03F 7/20* (2006.01)

(52) U.S. Cl.
CPC ............... *G03F 7/16* (2013.01); *G03F 7/168* (2013.01); *G03F 7/20* (2013.01)

(58) Field of Classification Search
USPC ............. 430/270.1, 322, 325, 329, 330, 331
See application file for complete search history.

(56) References Cited

FOREIGN PATENT DOCUMENTS

| JP | 2009-134088 A | 6/2009 | |
|---|---|---|---|
| JP | WO 2013069544 A1 * | 5/2013 | ......... H01L 21/0337 |
| JP | WO 2014003023 A1 * | 1/2014 | ............. B82Y 40/00 |

* cited by examiner

US 9,587,065 B2

COMPOSITION FOR PATTERN FORMATION, AND PATTERN-FORMING METHOD

CROSS-REFERENCE TO RELATED APPLICATIONS

The present application claims priority to Japanese Patent Application No. 2014-097238, filed May 8, 2014. The contents of this application are incorporated herein by reference in their entirety.

BACKGROUND OF THE INVENTION

Field of the Invention

The present invention relates to a composition for pattern formation, and a pattern-forming method.

Discussion of the Background

Pattern formation by means of lithography has been frequently executed in the field of semiconductor devices, liquid crystal devices, and the like. Such a pattern is exemplified by a pattern having a line width of 90 nm formed by using an ArF excimer laser. However, in recent years, miniaturization of the devices has progressed, and a further microfabrication of a pattern has been required.

To meet the demands described above, a variety of pattern-forming methods which utilize a phase separation structure constructed through directed self-assembly that spontaneously forms an ordered pattern have been proposed. By way of an example of such pattern-forming methods, a technology has been developed in which a composition that contains a block copolymer constituted with a plurality of blocks each having distinct properties is applied on a substrate, and subsequent annealing results in clustering of blocks having the same property, whereby phase separation is caused (see Japanese Unexamined Patent Application, Publication No. 2003-218383). In addition, a technology has also been developed in which, in order to improve the regularity of a pattern in the directed self-assembling film, a guide layer is overlaid on a substrate, and a directed self-assembling film is formed on the guide layer (see Japanese Unexamined Patent Application, Publication No. 2008-149447).

SUMMARY OF THE INVENTION

According to one aspect of the present invention, a composition for pattern formation includes a block copolymer. The block polymer includes a first labile group at an end of a main chain of the block copolymer. The first acid liable group is capable of being dissociated by an acid or heat.

According to another aspect of the present invention, a pattern-forming method includes applying the composition directly or indirectly on a substrate to provide a first film. The first film is exposed. A second film is provided on the first film. The second film is a directed self-assembling film including a phase separation structure which includes a plurality of phases. A part of the plurality of phases of the second film is removed.

According to further aspect of the present invention, a pattern-forming method includes applying the composition directly or indirectly on a substrate to provide a first film that is a directed self-assembling film including a phase separation structure which includes a plurality of phases. The first film is exposed. A part of the plurality of phases of the first film is removed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
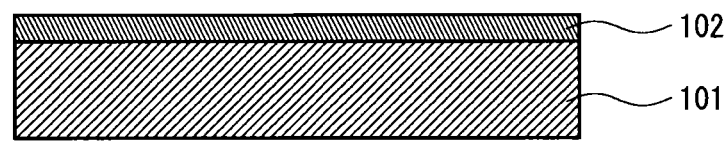
FIG. 1 shows a schematic view illustrating one example of a state after forming an underlayer film on a substrate in a pattern-forming method according to an embodiment of the present invention.

According to an embodiment of the invention, a composition for pattern formation contains a block copolymer that includes a first labile group capable of being dissociated by an acid or heat at an end of the main chain thereof (hereinafter, may be also referred to as "(A) block copolymer" or "block copolymer (A)").

According to another embodiment of the invention, a pattern-forming method includes: providing a first film directly or indirectly on a substrate by using the composition for pattern formation according to the embodiment of the invention; exposing the first film; providing on the first film, a second film that is a directed self-assembling film having a phase separation structure; and removing a part of a plurality of phases of the second film.

According to still another embodiment of the present invention, a pattern-forming method includes: providing a first film that is a directed self-assembling film having a phase separation structure, directly or indirectly on a substrate by using the composition for pattern formation according to the embodiment of the invention; exposing the first film; and removing a part of a plurality of phases of the first film.

The "directed self-assembly" and "directed self-assembling" as referred to herein means a phenomenon of spontaneously constructing a tissue or a structure without resulting from only the control from an external factor. The expression "capable of being dissociated by an acid or heat" as referred to means being capable of being dissociated by an action of an acid generated from (B) an acid generator, or being dissociated by heating carried out in the formation of a directed self-assembling film or an underlayer film. The "main chain" as referred to means the longest linking chain in a block copolymer.

The composition for pattern formation and the pattern-forming method according to the embodiments of the present invention enable a directed self-assembling film that is superior in phase separation ability and leads to superior rectangularity of the cross-sectional shape of a pattern (i.e., tailing of a pattern configuration is reduced) to be obtained. Therefore, these can be suitably used for pattern formation in manufacture of semiconductor devices, and the like in which further progress of miniaturization is expected in the future.

Hereinafter, embodiments of the composition for pattern formation, and the pattern-forming method according to the present invention are explained in detail.

Composition for Pattern Formation

A composition for pattern formation according to an embodiment of the present invention contains (A) a block copolymer. In addition, the composition for pattern formation may further contain (B) an acid generator as a favorable component, and may also contain other optional component(s) such as (C) a solvent, within a range not leading to impairment of the effects of the present invention.

The block copolymer (A) is constituted with a plurality of types of blocks. Each block may be derived from either one type of monomer, or a plurality of types of monomers. Moreover, at least one type of monomers among monomers constituting each block are different from each other.

The block is exemplified by a block having a (meth) acrylic acid ester structure, a block having a styrene structure, a block having a vinyl acetal structure, a block having a urethane structure, a block having a urea structure, a block having an imide structure, a block having an amide structure, a block having an epoxy structure, a block having a novolak-type phenol structure, a block having an ester structure other than a (meth)acrylic acid ester structure, and the like.

The block copolymer (A) is preferably a polymer capable of forming a phase separation structure through directed self-assembly. When such a block copolymer (A) is dissolved in an appropriate solvent, the same kind of blocks are aggregated, and thus phases each configured with the same type of the block are formed. In this process, it is presumed that a phase separation structure having an ordered pattern in which different types of phases are periodically and alternately repeated can be formed since the phases formed with different types of the blocks are unlikely to be admixed with each other.

The block copolymer (A) preferably includes a first block that has a structural unit having a styrene structure (hereinafter, may be also referred to as "structural unit (I)") and a second block that has a structural unit having a (meth)acrylic acid ester structure (hereinafter, may be also referred to as "structural unit (II)"). When the blocks in the block copolymer (A) include a combination of the first block and the second block, the phase separation ability of the resulting directed self-assembling film may be further improved.

(A) Block Copolymer

The block copolymer (A) includes a first labile group capable of being dissociated by an acid or heat at an end of the main chain thereof. Thus, the composition for pattern formation enables a directed self-assembling film that is superior in phase separation ability and leads to superior rectangularity of the cross-sectional shape of a pattern to be obtained. Although not necessarily clarified, the reason for achieving the effects described above resulting from the composition for film formation having the aforementioned constitution is presumed to be as in the following. Specifically, due to the block copolymer (A) including the first labile group at an end of the main chain thereof, the first labile group would be dissociated by an acid or heat, resulting in formation of a polar group such as a carboxy group at an end of the main chain of the block copolymer (A). Thus, the polarity of the block to which the polar group bonds would be drastically increased. Accordingly, the contrast of the polarity between the blocks included in the block copolymer (A) would be increased.

Thus, in a case where an underlayer film that does not include any phase separation structure is formed using the composition for pattern formation, and a directed self-assembling film is formed on the underlayer film using other composition for directed self-assembling film formation or the composition for pattern formation according to the embodiment of the present invention, it is presumed that the phase separation ability of the directed self-assembling film formed on the underlayer film and the rectangularity of the cross-sectional shape of a pattern can be improved, since the contrast of the polarity between the phases of the underlayer film is increased as described above.

Alternatively, in a case where the block copolymer (A) is a polymer capable of forming a phase separation structure through directed self-assembly, it is expected that the phase separation of the block copolymer (A) will favorably occur due to the increase of the contrast of the polarity between the phases as described above. Thus, a fine phase separation structure may be formed. In addition, it is expected that a part of a plurality of the phases can be efficiently removed after the directed self-assembly due to the increased contrast of the polarity. Consequently, the phase separation ability of the resulting directed self-assembling film and the rectangularity of the cross-sectional shape of the pattern may be further improved.

Further, in a case where the block copolymer (A) is a polymer capable of forming a phase separation structure through directed self-assembly, it is expected that due to the underlayer film being formed by using the composition for pattern formation, the underlayer film has a fine phase separation structure, and the contrast of the polarity between the phases thereof is increased, as described above. Thus, it is expected that when the directed self-assembling film is formed on the underlayer film, the phase separation ability of the resulting directed self-assembling film and the rectangularity of the cross-sectional shape of the pattern can be further improved.

Also, the block copolymer (A) preferably has a structural unit that includes a crosslinkable group on a side chain thereof (hereinafter, may be also referred to as "structural unit (a)"), or a structural unit that includes a second labile group capable of being dissociated by an acid or heat on a side chain thereof (hereinafter, may be also referred to as "structural unit (b)").

Further, it is preferred that the block copolymer (A) has a structural unit that includes a crosslinkable group on a side chain thereof and has a styrene structure (hereinafter, may be also referred to as "structural unit (I-a)"), and it is also preferred that the block copolymer (A) has a structural unit that includes a second labile group on a side chain thereof and has a (meth)acrylic acid ester structure (hereinafter, may be also referred to as "structural unit (II-b)").

The block copolymer (A) is exemplified by a diblock copolymer, a triblock copolymer, a tetrablock copolymer, and the like. Of these, a diblock copolymer and a triblock copolymer are preferred. In addition, when the block copolymer (A) is a triblock copolymer, it is preferred that only two kinds of blocks are involved. When the block copolymer (A) has the structure described above, phase separation of the composition for pattern formation is further facilitated.

First Labile Group

The first labile group is capable of being dissociated by an acid or heat, and is present at least one end of the main chain.

The first labile group is exemplified by a protecting group which substitutes a hydrogen atom of a carboxy group, a hydroxyl group, etc. at the end of the main chain and thus protects the same, and the like.

Examples of the protecting group for the carboxy group include:

trialkylsilyl groups such as a trimethylsilyl group and a dimethylbutylsilyl group;

1-alkoxyalkyl groups such as a 1-ethoxyethyl group and a 1-propoxyethyl group;

cyclic ethers such as a tetrahydrofuranyl group and a tetrahydropyranyl group;

an alkyl group having a quaternary carbon atom which is represented by the following formula (i); and the like. Of these, a 1-alkoxyalkyl group is more preferred, and a 1-propoxyethyl group is still more preferred.

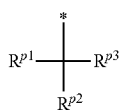

(i)

In the above formula (i), $R^{p1}$ represents a monovalent hydrocarbon group having 1 to 20 carbon atoms; $R^{p2}$ and $R^{p3}$ each independently represent a monovalent chain hydrocarbon group having 1 to 20 carbon atoms or a monovalent alicyclic hydrocarbon group having 3 to 20 carbon atoms, or $R^{p2}$ and $R^{p3}$ taken together represent an alicyclic structure having 3 to 20 ring atoms together with the carbon atom to which $R^{p2}$ and $R^{p3}$ bond; and * denotes a binding site to an oxygen atom of a carboxy group in the case of a carboxy group being present at the end of the main chain.

The "hydrocarbon group" as referred to herein includes chain hydrocarbon groups, alicyclic hydrocarbon groups and aromatic hydrocarbon groups. This "hydrocarbon group" is a saturated hydrocarbon group or an unsaturated hydrocarbon group. The "chain hydrocarbon group" as referred to means a hydrocarbon group that is constituted with only a chain structure without including a cyclic structure, and the term "chain hydrocarbon" includes both linear hydrocarbons and branched hydrocarbons. The "alicyclic hydrocarbon group" as referred to means a hydrocarbon group that includes as a ring structure not an aromatic ring structure but only an alicyclic structure, and the term "alicyclic hydrocarbon" includes both monocyclic alicyclic hydrocarbons and polycyclic alicyclic hydrocarbons. However, it is not necessary for the alicyclic hydrocarbon group to be constituted with only an alicyclic structure, and a part thereof may include a chain structure. The "aromatic hydrocarbon group" as referred to means a hydrocarbon group that includes an aromatic ring structure as a ring structure. However, it is not necessary for the aromatic hydrocarbon group to be constituted with only an aromatic ring structure, and a part thereof may include a chain structure or an alicyclic structure. The "number of ring atoms" as referred to means the number of atoms constituting a ring of an alicyclic structure and an aliphatic heterocyclic structure, and in regard to a polycyclic alicyclic structure and a polycyclic aliphatic heterocyclic structure, the "number of ring atoms" as referred to means the number of atoms constituting the polycyclic structure.

Examples of the monovalent hydrocarbon group having 1 to 20 carbon atoms represented by $R^{p1}$ include:

chain hydrocarbon groups e.g., alkyl groups such as a methyl group, an ethyl group, a propyl group and a butyl group;

alkenyl groups such as an ethenyl group, a propenyl group and a butenyl group; and alkynyl groups such as an ethynyl group, a propynyl group and a butynyl group;

alicyclic hydrocarbon groups e.g., cycloalkyl groups such as a cyclopropyl group, a cyclopentyl group, a cyclohexyl group, a norbornyl group and an adamantyl group; and cycloalkenyl groups such as a cyclopropenyl group, a cyclopentenyl group, a cyclohexenyl group and a norbornenyl group;

aromatic hydrocarbon groups e.g., aryl groups such as a phenyl group, a tolyl group, a xylyl group, a naphthyl group and an anthryl group; and aralkyl groups such as a benzyl group, a phenethyl group and a naphthylmethyl group; and the like.

$R^{p1}$ represents preferably a chain hydrocarbon group or a cycloalkyl group, more preferably an alkyl group or a cycloalkyl group, and still more preferably a methyl group, an ethyl group, a propyl group, a cyclopentyl group, a cyclohexyl group, a cyclooctyl group or an adamantyl group.

Examples of the monovalent chain hydrocarbon group having 1 to 20 carbon atoms which may be represented by $R^{p2}$ or $R^{p3}$ include monovalent chain hydrocarbon groups among the groups exemplified as the monovalent hydrocarbon group in connection with $R^{p1}$, and the like.

Examples of the monovalent alicyclic hydrocarbon group having 3 to 20 carbon atoms which may be represented by $R^{p2}$ or $R^{p3}$ include:

saturated monocyclic hydrocarbon groups such as a cyclopropyl group, a cyclobutyl group, a cyclopentyl group, a cyclohexyl group, a cycloheptyl group, a cyclooctyl group, a cyclodecyl group and a cyclododecyl group;

unsaturated monocyclic hydrocarbon groups such as a cyclopropenyl group, a cyclobutenyl group, a cyclopentenyl group, a cyclohexenyl group, a cyclooctenyl group and a cyclodecenyl group;

saturated polycyclic hydrocarbon groups such as a bicyclo[2.2.1]heptanyl group, a bicyclo[2.2.2]octanyl group and a tricyclo[3.3.1.1$^{3,7}$]decanyl group;

unsaturated polycyclic hydrocarbon groups such as a bicyclo[2.2.1]heptenyl group and a bicyclo[2.2.2]octenyl group; and the like.

Examples of the alicyclic structure having 3 to 20 ring atoms which may be taken together represented by $R^{p2}$ and $R^{p3}$ together with the carbon atom to which $R^{p2}$ and $R^{p3}$ bond include:

monocyclic cycloalkane structures such as a cyclopropane structure, a cyclobutane structure, a cyclopentane structure, a cyclopentene structure, a cyclopentadiene structure, a cyclohexane structure, a cyclooctane structure and a cyclodecane structure;

polycyclic cycloalkane structures such as a norbornane structure, an adamantane structure, a tricyclodecane structure and a tetracyclododecane structure; and the like.

It is preferred that $R^{p2}$ and $R^{p3}$ each independently represent an alkyl group, or $R^{p2}$ and $R^{p3}$ taken together represent a monocyclic cycloalkane structure, a norbornane structure or an adamantane structure, and it is more preferred that $R^{p2}$ and $R^{p3}$ each independently represent a methyl group or an ethyl group, or $R^{p2}$ and $R^{p3}$ taken together represent a cyclopentane structure, a cyclohexane structure or an adamantane structure.

Moreover, examples of the group represented by the above formula (i) include groups represented by the following formulae (i-1) to (i-4), and the like.

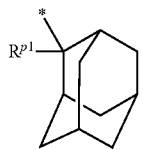
(i-1)

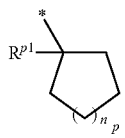
(i-2)

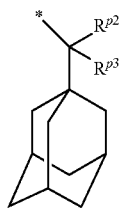
(i-3)

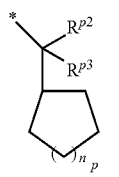
(i-4)

In the above formulae (i-1) to (i-4), $R^{p1}$, $R^{p2}$, $R^{p3}$ and * are as defined in the above formula (i), and $n_p$ is an integer of 1 to 4.

Preferably $n_p$ is 1, 2 or 4, and more preferably 1.

Examples of the protecting group for the hydroxyl group include:

groups forming an acetal structure such as a 1-alkoxyalkyl group;

acyl groups such as an acetyl group and a trifluoroacetyl group; and the like. Of these, groups forming an acetal structure are preferred, and a 1-alkoxyalkyl group is more preferred.

The first labile group is preferably represented by the following formula (a). When the first labile group is the group represented by the following formula (a), the first labile group bonds to an oxygen atom of a carboxy group, a hydroxyl group or the like to form a hemiacetal ester group at an end of the main chain of the block copolymer (A). Accordingly, the contrast of the polarity described above can be improved more easily by heating or the like.

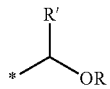
(a)

In the above formula (a), R represents a monovalent organic group having 1 to 20 carbon atoms; R' represents a hydrogen atom or a monovalent organic group having 1 to 20 carbon atoms; and * denotes a binding site to an atom at the end of the main chain of the block copolymer.

The "organic group" as referred to herein means a group that includes at least one carbon atom.

The monovalent organic group having 1 to 20 carbon atoms which may be represented by R or R' is exemplified by: a monovalent hydrocarbon group; a group that includes a hetero atom-containing group between two carbon atoms in the hydrocarbon group; a group obtained by substituting a part or all of hydrogen atoms included in these groups with a substituent; and the like.

Examples of the monovalent hydrocarbon group include groups similar to those exemplified in connection with $R^{p1}$, and the like.

The hetero atom-containing group as referred to means a group that has a hetero atom having a valency of no less than 2 in the structure thereof. The hetero atom-containing group may have either one, or two or more hetero atom(s) having a valency of no less than 2.

The hetero atom having a valency of no less than 2 which may be included in the hetero atom-containing group is not particularly limited as long as the hetero atom has an atomic valency of no less than 2, and examples thereof include an oxygen atom, a nitrogen atom, a sulfur atom, a silicon atom, a phosphorus atom, a boron atom, and the like. Of these, an oxygen atom is preferred.

Examples of the hetero atom-containing group include: groups constituted with only hetero atom(s) such as —SO—, —SO$_2$—, —SO$_2$O—, and —SO$_3$—;

groups obtained by combining at least one carbon atom(s) and at least one hetero atom(s) such as —CO—, —COO—, —COS—, —CONH—, —OCOO—, —OCOS—, —OCONH—, —SCONH—, —SCSNH—, and —SCSS—; and the like.

Examples of the substituent include halogen atoms, a hydroxy group, a carboxy group, a nitro group, a cyano group, and the like.

R represents preferably a chain hydrocarbon group, an alicyclic hydrocarbon group, a hetero atom-containing chain hydrocarbon group, or a hetero atom-containing alicyclic hydrocarbon group, and more preferably an alkyl group, a cycloalkyl group, a vinyloxyalkyl group, or a vinyloxycycloalkyl group.

R' represents preferably a chain hydrocarbon group, more preferably an alkyl group, and still more preferably a methyl group.

The first labile group is preferably present at an end of the main chain of the second block. Thus, the second block having a (meth)acrylic acid ester structure has higher polarity as compared with other blocks such as the first block having a styrene structure. When the group capable of being dissociated by an acid or heat is included at the end of the main chain of the second block, it is expected that the contrast of the polarity between the second block and the other blocks may be increased, and consequently, a directed self-assembling film having a more favorable phase separation structure can be obtained.

Structural Unit (I)

The structural unit (I) has a styrene structure. The structural unit (I) may also be: the structural unit (I-a); a structural unit that includes a second labile group capable of being dissociated by an acid or heat on a side chain thereof (hereinafter, may be also referred to as "structural unit (I-b)"); or the like.

Structural Unit (II)

The structural unit (II) has a (meth)acrylic acid ester structure. Similarly to the structural unit (I), the structural unit (II) may also be: a structural unit that includes a crosslinkable group on a side chain thereof (hereinafter, may be also referred to as "structural unit (II-a)"); the structural unit (II-b); or the like.

Structural Unit (a)

The structural unit (a) includes a crosslinkable group on a side chain thereof. The crosslinkable group as referred to means a group capable of forming a chemical bond to a group having the same chemical structure through a reaction under a heating condition, an active energy ray-irradiating condition, an acidic condition or the like. When the block copolymer (A) has the structural unit (a), at least a part of blocks of the block copolymer (A) are crosslinked, leading to facilitation of the directed self-assembly of the directed self-assembling film. Consequently, it is expected that the phase separation ability of the resulting directed self-assembling film will be improved.

In addition, in a case where the block copolymer (A) is capable of forming a phase separation structure through directed self-assembly, it is expected that the etching resistance of at least a part of a plurality of phases of the block copolymer (A) will be enhanced due to crosslinking thereof, leading to a further improvement of the rectangularity of the cross-sectional shape of a pattern.

Examples of the crosslinkable group include:

groups that have a reactive unsaturated double bond, such as a vinyl group, a vinyl ether group and a (meth)acryloyl group;

ring-opening polymerization-reactive groups, e.g., cyclic ether groups such as an oxiranyl group, an oxetanyl group and a tetrahydrofurfuryl group;

groups having an active hydrogen, such as a hydroxyl group, a methylol group, a carboxy group, an amino group, a phenolic hydroxyl group, a mercapto group, a hydrosilyl group and a silanol group;

groups that include a group which can be substituted by a nucleophile, such as an active halogen atom-containing group, a sulfonic acid ester group and a carbamoyl group;

acid anhydride groups; and the like.

Of these, the crosslinkable group is preferably a group that has a reactive unsaturated double bond, or a cyclic ether group, more preferably a vinyl group, a vinyl ether group, an oxiranyl group, an oxetanyl group, or a tetrahydrofurfuryl group, and still more preferably a vinyl group.

The structural unit (a) is exemplified by: the structural unit (I-a); the structural unit (II-a); a structural unit that has neither a styrene structure nor a (meth)acrylic acid ester structure and includes a crosslinkable group on a side chain thereof; and the like. Of these, the structural unit (I-a) is preferred, and a structural unit derived from vinylstyrene is more preferred. Thus, when the block copolymer (A) includes the first block having a styrene structure, and the first block includes a crosslinkable group, it is expected that the contrast of the polarity between the blocks of the block copolymer (A) will be further enhanced. Consequently, the phase separation ability of the resulting directed self-assembling film may be further improved.

In addition, in a case where the block copolymer (A) is capable of forming a phase separation structure through directed self-assembly, the first block having a styrene structure exhibits superior etching resistance as compared with the second block having a (meth)acrylic acid ester structure, and the like. Furthermore, the etching resistance of phases formed from the first block may be further improved due to the presence of the crosslinkable group. Consequently, the rectangularity of the cross-sectional shape of a pattern may be further improved.

Structural Unit (b)

The structural unit (b) includes a second labile group capable of being dissociated by an acid or heat on a side chain thereof. When the second labile group is dissociated by an acid or heat to generate a carboxy group or the like, the hydrophilicity of at least one type of blocks may be increased. When the difference in the hydrophilicity between the blocks in the block copolymer (A) is thus increased, phases in the resulting directed self-assembling film may be efficiently oriented, resulting in formation of a fine microdomain structure.

In addition, in a case where the block copolymer (A) is capable of forming a phase separation structure through directed self-assembly, it is expected that an etching rate of the phases that include the second labile group will be increased after the dissociation, and consequently the etching selectivity among the phases of the block copolymer (A) will be improved, leading to a further improvement of the rectangularity of the cross-sectional shape of a pattern.

The structural unit (b) is exemplified by a structural unit (I-b) or (II-b) represented by the following formula (1-1) or (1-2). In the following formulae (1-1) and (1-2), the group represented by $-CR^{p1}R^{p2}R^{p3}$ or $-CR^{p4}R^{p5}R^{p6}$ is the group capable of being dissociated by an acid.

(1-1)

(1-2)

In the formula (2-1), $R^{p4}$, $R^{p5}$ and $R^{p6}$ each independently represent a monovalent hydrocarbon group having 1 to 20 carbon atoms or a monovalent oxyhydrocarbon group having 1 to 20 carbon atoms; $L^1$ represents a single bond, $-O-$, $-COO-$ or $-CONH-$; and $R^4$ represents a hydrogen atom, a fluorine atom, a methyl group or a trifluoromethyl group.

In the above formula (2-2), $R^{p1}$, $R^{p2}$ and $R^{p3}$ are as defined in the above formula (i); and $R^B$ represents a hydrogen atom, a fluorine atom, a methyl group or a trifluoromethyl group.

Examples of the monovalent hydrocarbon group having 1 to 20 carbon atoms which may be represented by $R^{p4}$, $R^{p5}$ or $R^{p6}$ include groups similar to those exemplified in connection with $R^{p1}$, and the like.

Examples of the monovalent oxyhydrocarbon group having 1 to 20 carbon atoms which may be represented by $R^{p4}$, $R^{p5}$ or $R^{p6}$ include the monovalent hydrocarbon group having 1 to 20 carbon atoms exemplified in connection with $R^{p1}$ in which an oxygen atom is included between carbon atoms, and the like.

$R^{p4}$, $R^{p1}$ and $R^{p6}$ preferably represent a chain hydrocarbon group, or an alicyclic hydrocarbon group including an oxygen atom.

$L^1$ preferably represents a single bond, or —COO—, and more preferably a single bond.

In light of copolymerizability of a monomer that gives the structural unit (I-b), $R^A$ represents preferably a hydrogen atom or a methyl group, and more preferably a hydrogen atom.

In light of copolymerizability of a monomer that gives the structural unit (II-b), $R^B$ represents preferably a hydrogen atom or a methyl group, and more preferably a methyl group.

Examples of the structural unit (I-b) include structural units represented by the following formulae.

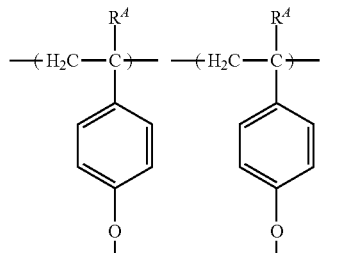

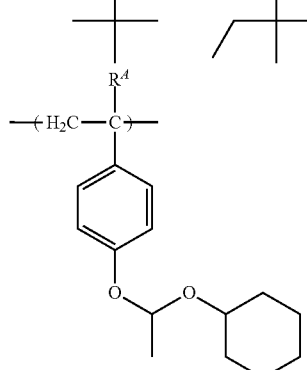

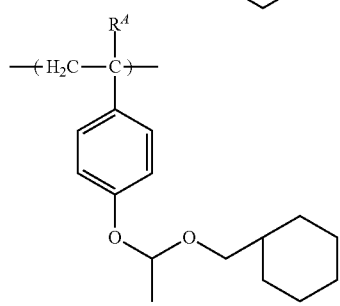

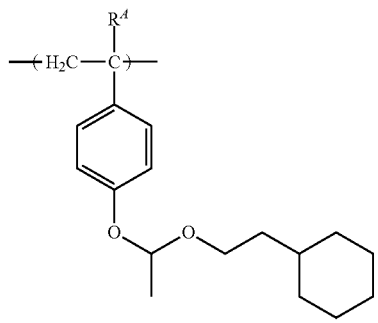

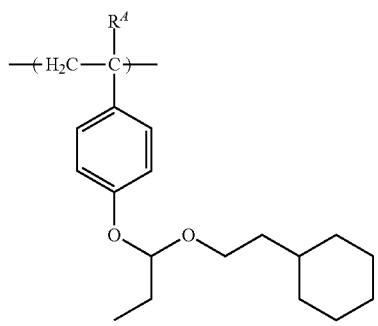

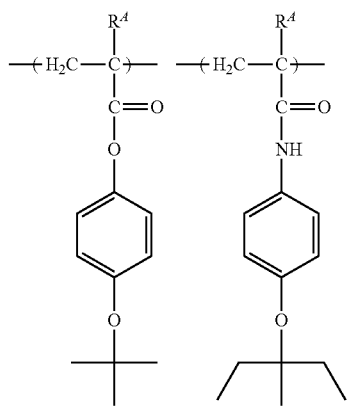

In the above formulae, $R^A$ is as defined in the above formula (1-1).

Examples of the structural unit (II-b) include the structural units represented by the following formulae (1-2-1) to (1-2-4) (hereinafter, may be also referred to as "structural units (II-b-1) to (II-b-4)"), and the like.

(1-2-1)

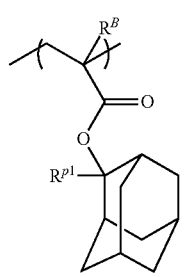

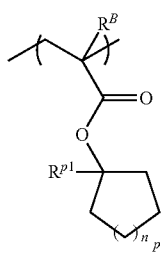
(1-2-2)
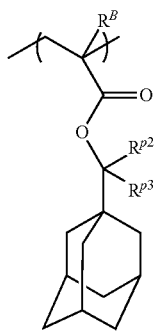
(1-2-3)
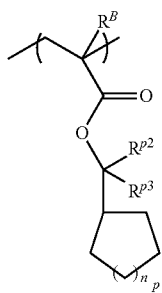
(1-2-4)
In the above formulae (1-2-1) to (1-2-4), $R^B$, $R^{p1}$ to $R^{p3}$ and $n_p$ are as defined in the above formula (1-2).
Examples of the structural unit (II-b) include structural units represented by the following formulae, and the like.
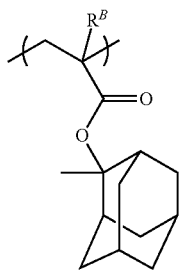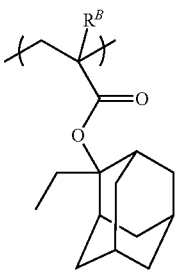
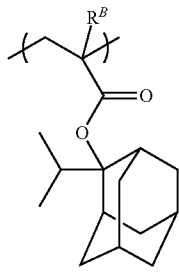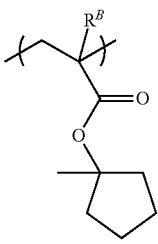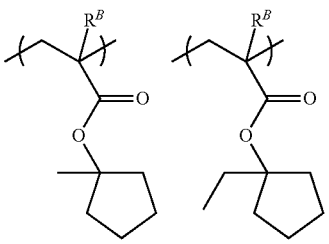
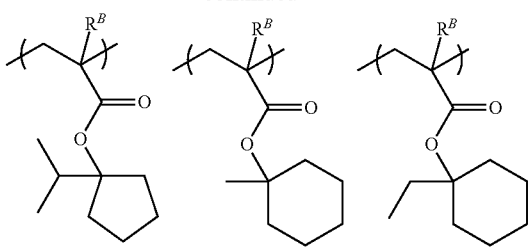
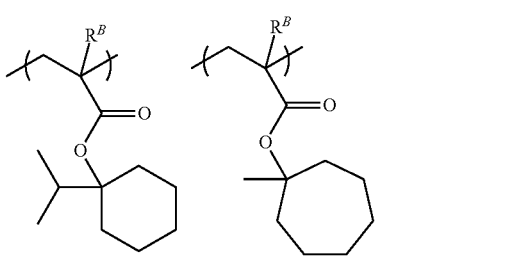
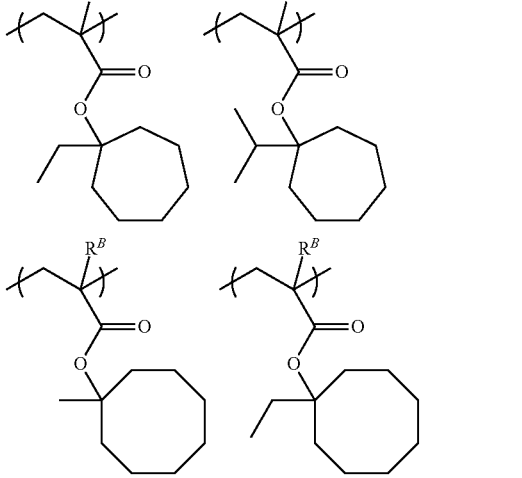
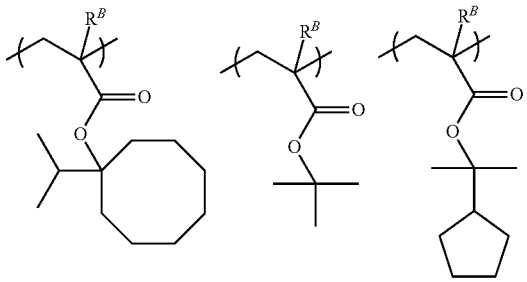
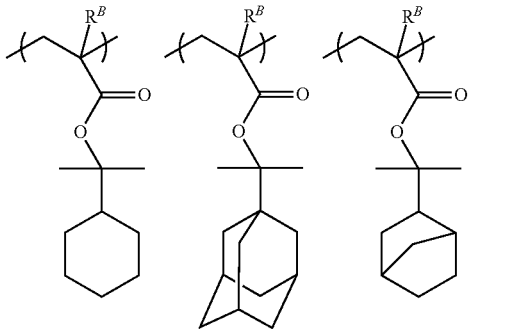

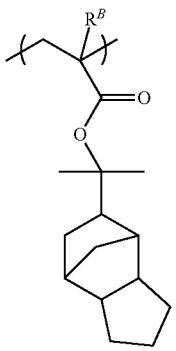

In the above formulae, $R^B$ is as defined in the above formula (1-2).

The structural unit (b) is preferably the structural unit (II-b), more preferably the structural unit (II-b-1), (I-b-2) or (II-b-3), and still more preferably a structural unit derived from 2-methyl-2-adamantyl(meth)acrylate, a structural unit derived from 2-i-propyl-2-adamantyl(meth)acrylate, a structural unit derived from 1-methyl-1-cyclopentyl(meth)acrylate, a structural unit derived from 1-ethyl-1-cyclohexyl (meth)acrylate, a structural unit derived from 1-i-propyl-1-cyclopentyl(meth)acrylate, a structural unit derived from 2-cyclohexyl-propan-2-yl(meth)acrylate, or a structural unit derived from 2-(adamantan-1-yl)propan-2-yl(meth)acrylate. When the structural unit (b) thus has an acrylic acid ester structure, the polarity of the second block of the block copolymer (A) may be further increased, and consequently, the phase separation ability of the resulting directed self-assembling film may be further improved.

The proportion of the structural unit (b) with respect to the total structural units constituting the block copolymer (A) is preferably no less than 0.5 mol % and no greater than 10 mol %, and more preferably no less than 1 mol % and no greater than 5 mol %. When the proportion falls within the above range, the contrast of the polarity of the composition for pattern formation can be satisfactorily ensured, and consequently, the phase separation ability of the resulting directed self-assembling film and the rectangularity of the cross-sectional shape of the pattern may be improved.

Production Method of Block Copolymer (A)

The block copolymer (A) may be obtained by executing an end treatment after the completion of block copolymerization to form the first labile group at an end of the main chain thereof. More specifically, the block copolymer that has the first labile group bound to an end thereof can be obtained by executing the block copolymerization, terminating the polymerization, and thereafter modifying the end of the block copolymer.

The block copolymer (A) can be synthesized by living anionic polymerization, living radical polymerization or the like, and of these, living anionic polymerization that enables an arbitrary end structure to be readily introduced is more preferred. For example, the block copolymer (A) can be synthesized by linking the polystyrene block, the polymethyl methacrylate block and a block other than these blocks in a desired order while permitting polymerization, terminating the polymerization, and thereafter executing the end treatment.

For example, in a case where the block copolymer (A) is a diblock copolymer constituted with a polystyrene block and a polymethyl methacrylate block, the first labile group is the group represented by the above formula (a), and R' in the above formula (a) represents a methyl group, the synthesis of the block copolymer (A) can be achieved by the following procedure. The polystyrene block is first synthesized by polymerizing styrene in an appropriate solvent using an anionic polymerization initiator. Next, methyl methacrylate is similarly polymerized so as to link to the polystyrene block, whereby the polymethyl methacrylate block is synthesized. Thereafter, the polymerization end is terminated using carbon dioxide, and a vinyl ether represented by $CH_2=CH-OR$, wherein R represents a monovalent organic group having 1 to 20 carbon atoms, is allowed to add thereto in the presence of an acid catalyst such as phosphoric acid 2-ethylhexyl ester, a paratoluenesulfonic acid pyridinium salt or paratoluenesulfonic acid, whereby the first labile group can be introduced into the end of the main chain of the polymethyl methacrylate block. It is to be noted that for executing the block copolymerization, for example, a method in which a solution containing a monomer is added dropwise to a reaction solvent containing an initiator to allow for a polymerization reaction, or the like may be employed.

Examples of the solvent for use in the polymerization include:

alkanes such as n-pentane, n-hexane, n-heptane, n-octane, n-nonane and n-decane;

cycloalkanes such as cyclohexane, cycloheptane, cyclooctane, decalin and norbornane;

aromatic hydrocarbons such as benzene, toluene, xylene, ethylbenzene and cumene;

saturated carboxylic acid esters such as ethyl acetate, n-butyl acetate, i-butyl acetate and methyl propionate;

ketones such as acetone, 2-butanone, 4-methyl-2-pentanone and 2-heptanone;

ethers such as tetrahydrofuran, dimethoxyethanes and diethoxyethanes; and the like. These solvents may be used either alone, or two or more types thereof may be used in combination.

The reaction temperature in the polymerization may be appropriately predetermined in accordance with the type of the initiator, and the reaction temperature is typically no less than −150° C. and no greater than 50° C., and preferably no less than −80° C. and no greater than 40° C. The reaction time period is typically no less than 5 min and no greater than 24 hrs, and preferably no less than 20 min and no greater than 12 hrs.

Examples of the initiator for use in the polymerization include alkyllithiums, alkylmagnesium halides, naphthalene sodium, alkylated lanthanoid compounds, and the like. Of these, when the polymerization is carried out by using styrene and methyl methacrylate as a monomer, an alkyllithium compounds are preferably used.

St
|
sec-BuLi
LiCl
diphenylethylene
↓

-continued

MMA

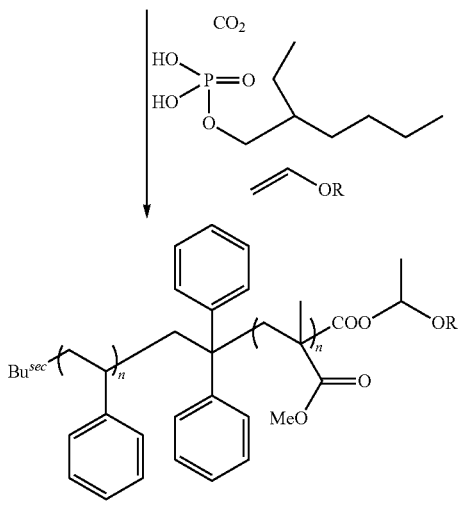

In the above scheme, n and m are an integer of 10 to 5,000; and R represents a monovalent organic group having 1 to 20 carbon atoms.

The block copolymer (A) subjected to the end treatment is preferably recovered by a reprecipitation technique. More specifically, after completing the end treatment reaction, the reaction liquid is charged into a reprecipitation solvent to recover the intended copolymer in the form of a powder. As the reprecipitation solvent, an alcohol, an alkane and the like may be used either alone or as a mixture of two or more thereof. In addition to or in place of the reprecipitation technique, a liquid separation operation, a column operation, an ultrafiltration operation or the like may be employed to recover the polymer through eliminating low molecular weight components such as monomers and oligomers.

The weight average molecular weight (Mw) of the block copolymer (A) as determined by gel permeation chromatography (GPC) is preferably no less than 1,000 and no greater than 150,000, more preferably no less than 1,500 and no greater than 120,000, and still more preferably no less than 2,000 and no greater than 100,000. When the block copolymer (A) has an Mw falling within the above specific range, the phase separation ability of the composition for pattern formation and the rectangularity of the cross-sectional shape of the pattern may be further improved.

The ratio (Mw/Mn) of the Mw to the number average molecular weight (Mn) of the block copolymer (A) is typically no less than 1 and no greater than 5, preferably no less than 1 and no greater than 3, more preferably no less than 1 and no greater than 2, still more preferably no less than 1 and no greater than 1.5, and particularly preferably no less than 1 and no greater than 1.2. When the Mw/Mn falls within such a specific range, the composition for pattern formation enables a pattern having a finer and more favorable microdomain structure to be formed.

It is to be noted that the Mw and the Mn are determined by gel permeation chromatography (GPC) using: GPC columns (G2000HXL×2, G3000HXL×1, and G4000HXL×1, all manufactured by Tosoh Corporation); a differential refractometer as a detector; and mono-dispersed polystyrene as a standard, under an analytical condition involving a flow rate of 1.0 mL/min, an elution solvent of tetrahydrofuran, a sample concentration of 1.0% by mass, the amount of an injected sample of 100 μL, and a column temperature of 40° C.

(B) Acid Generator

The acid generator (B) is a compound that generates an acid upon irradiation with a radioactive ray. The acid-labile group of the block copolymer (A) is dissociated by an action of the acid to generate an alkali-soluble group. As a result, the polarity of the block copolymer (A) is altered. The acid generator (B) may be contained either in the form of a compound as described later (hereinafter, may be appropriately referred to as "(B) acid generating agent" or "acid generating agent (B)"), or in the form incorporated as a part of the polymer, or may be in both of these forms.

The acid generating agent (B) is exemplified by an onium salt compound, an N-sulfonylimide compound, a halogen-containing compound, a diazo ketone compound, and the like.

Examples of the onium salt compound include sulfonium salts, iodonium salts, tetrahydrothiophenium salts, phosphonium salts, diazonium salts, pyridinium salts, and the like.

Specific examples of the acid generator (B) include the compounds disclosed in paragraphs [0080] to [0113] of Japanese Unexamined Patent Application, Publication No. 2009-134088, for example, and the like.

It is preferred that the acid generator (B) includes a compound represented by the following formula (2-1) or (2-2). When the acid generator (B) includes a compound having the following structure, it is expected that a diffusion length of the acid generated upon the exposure in a film formed from the composition for pattern formation will be more properly decreased through e.g., an interaction with the structural unit (II) of the block copolymer (A) or the like, consequently leading to a further improvement of the rectangularity of the cross-sectional shape of a pattern formed from the resulting directed self-assembling film.

$$R^1-SO_3^-X^+ \quad (2\text{-}1)$$

$$R^2-R^3-SO_3^-X^+ \quad (2\text{-}2)$$

In the above formulae (2-1) and (2-2), $X^+$ represents a monovalent radioactive ray-degradable onium cation.

In the above formula (2-1), $R^1$ represents a fluorinated alkyl group having 1 to 10 carbon atoms.

In the above formula (2-2), $R^2$ represents a monovalent group that includes an alicyclic structure having 6 or more ring atoms, or a monovalent group that includes an aliphatic heterocyclic structure having 6 or more ring atoms; and $R^3$ represents a fluorinated alkanediyl group having 1 to 10 carbon atoms.

Examples of the fluorinated alkyl group represented by $R^1$ include fluorinated alkyl groups obtained by substituting with a fluorine atom, a hydrogen atom included in the alkyl groups exemplified in connection with $R^{p1}$, and the like. Of these, a perfluoroalkyl group is preferred, a perfluoroalkyl group having 1 to 4 carbon atoms is more preferred, and a perfluorobutyl group is still more preferred.

Examples of the monovalent group that includes an alicyclic structure having 6 or more ring atoms which may be represented by $R^2$ include:

monocyclic cycloalkyl groups such as a cyclohexyl group, a cycloheptyl group, a cyclooctyl group, a cyclononyl group, a cyclodecyl group and a cyclododecyl group;

monocyclic cycloalkenyl groups such as a cyclohexenyl group, a cycloheptenyl group, a cyclooctenyl group and a cyclodecenyl group;

polycyclic cycloalkyl groups such as a norbornyl group, an adamantyl group, a tricyclodecyl group and a tetracyclododecyl group;

polycyclic cycloalkenyl groups such as a norbornenyl group and a tricyclodecenyl group; and the like.

Examples of the monovalent group that includes an aliphatic heterocyclic structure having 6 or more ring atoms which may be represented by $R^2$ include:

groups that include a lactone structure such as a norbornanelactone-yl group;

groups that include a sultone structure such as a norbornanesultone-yl group;

oxygen atom-containing heterocyclic groups such as an oxacycloheptyl group and an oxanorbornyl group;

nitrogen atom-containing heterocyclic groups such as an azacyclohexyl group, an azacycloheptyl group and a diazabicyclooctan-yl group;

sulfur atom-containing heterocyclic groups such as a thiacycloheptyl group and a thianorbornyl group; and the like.

In light of attaining a further proper diffusion length of the acid described above, the number of ring atoms included in the group represented by $R^2$ is preferably no less than 8, more preferably no less than 9 and no greater than 15, and still more preferably no less than 10 and no greater than 13.

Of these, $R^2$ represents preferably a monovalent group that includes an alicyclic structure having 9 or more ring atoms, or a monovalent group that includes an aliphatic heterocyclic structure having 6 or more ring atoms, and more preferably an adamantyl group, a hydroxyadamantyl group, a norbornanelactone-yl group, a 5-oxo-4-oxatricyclo[4.3.1.1$^{3,8}$]undecan-yl group, an adamantan-1-yloxycarbonyl group, a norbornanesultone-2-yloxycarbonyl group, or a piperidin-1-ylsulfonyl group.

Examples of the fluorinated alkanediyl group having 1 to 10 carbon atoms represented by $R^3$ include groups obtained by substituting with a fluorine atom, one or more hydrogen atoms included in an alkanediyl group having 1 to 10 carbon atoms such as a methanediyl group, an ethanediyl group and a propanediyl group, and the like.

Of these, a fluorinated alkanediyl group in which a fluorine atom bonds to a carbon atom adjacent to the $SO_3^-$ group is preferred, a fluorinated alkanediyl group in which two fluorine atoms bond to a carbon atom adjacent to the $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group, a 1,1,2,2-tetrafluorohexanediyl group, a 1,1,2-trifluorobutanediyl group and a 1,1,2,2,3,3-hexafluoropropanediyl group are still more preferred.

The monovalent radioactive ray-degradable onium cation represented by $X^+$ is degraded upon irradiation with exposure light. At a light-exposed site, a sulfonic acid is generated from a sulfonate anion, and a proton generated by degradation of the radioactive ray-degradable onium cation. The monovalent radioactive ray-degradable onium cation represented by $X^+$ is exemplified by radioactive ray-degradable onium cations that include an element such as S, I, O, N, P, Cl, Br, F, As, Se, Sn, Sb, Te or Bi. Examples of the cation that includes S (sulfur) as the element include sulfonium cations, tetrahydrothiophenium cations and the like, and examples of the cation that includes I (iodine) as the element include iodonium cations and the like. Of these, a sulfonium cation represented by the following formula (X-1), a tetrahydrothiophenium cation represented by the following formula (X-2), an iodonium cation represented by the following formula (X-3) are preferred.

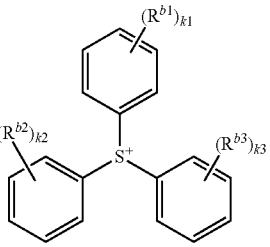

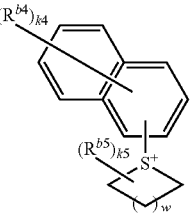

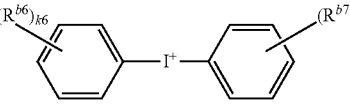

In the above formula (X-1), $R^{b1}$, $R^{b2}$ and $R^{b3}$ each independently represent an alkyl group having 1 to 12 carbon atoms, an aromatic hydrocarbon group having 6 to 12 carbon atoms, $-OSO_2-R^P$ or $-SO_2-R^Q$, wherein a part or all of hydrogen atoms included in the alkyl group or the aromatic hydrocarbon group are unsubstituted or substituted, or two or more of $R^{b1}$, $R^{b2}$ and $R^{b3}$ taken together represent a ring structure, and the rest of $R^{b1}$, $R^{b2}$ and $R^{b3}$ represents an alkyl group having 1 to 12 carbon atoms, an aromatic hydrocarbon group having 6 to 12 carbon atoms, $-OSO_2-R^P$ or $-SO_2-O$; $R^P$ and $R^Q$ each independently represent an alkyl group having 1 to 12 carbon atoms, an alicyclic hydrocarbon group having 5 to 25 carbon atoms, or an aromatic hydrocarbon group having 6 to 12 carbon atoms, wherein a part or all of hydrogen atoms included in these groups are unsubstituted or substituted; and k1, k2 and k3 are each independently an integer of 0 to 5, wherein in a case where each of $R^{b1}$ to $R^{b3}$, and each of $R^P$ and $R^Q$ are present in a plurality of number, a plurality of $R^{b1}$s to $R^{b3}$s, and a plurality of $R^P$s and $R^Q$s are each identical or different.

In the above formula (X-2), $R^{b4}$ represents an alkyl group having 1 to 8 carbon atoms or an aromatic hydrocarbon group having 6 to 8 carbon atoms, wherein a part or all of hydrogen atoms included in these groups are unsubstituted or substituted; k4 is an integer of 0 to 7, wherein in a case where $R^{b4}$ is present in a plurality of number, a plurality of $R^{b4}$s are identical or different, or the plurality of $R^{b4}$s optionally taken together represent a ring structure; $R^{b5}$ represents an alkyl group having 1 to 7 carbon atoms or an aromatic hydrocarbon group having 6 or 7 carbon atoms, wherein a part or all of hydrogen atoms included in these groups are unsubstituted or substituted; k5 is an integer of 0 to 6, wherein in a case where $R^{b5}$ is present in a plurality of number, a plurality of $R^{b5}$s are identical or different, and a plurality of $R^{b5}$s optionally taken together represent a ring structure; and w is an integer of 0 to 3.

In the above formula (X-3), $R^{b6}$ and $R^{b7}$ each independently represent an alkyl group having 1 to 12 carbon atoms, an aromatic hydrocarbon group having 6 to 12 carbon atoms, —OSO₂—$R^R$ or —SO₂—$R^S$, wherein a part or all of hydrogen atoms included in the alkyl group or the aromatic hydrocarbon group are unsubstituted or substituted, or two or more of $R^{b6}$s and $R^{b7}$s may taken together represent a ring structure; $R^R$ and $R^S$ each independently represent an alkyl group having 1 to 12 carbon atoms, an alicyclic hydrocarbon group having 5 to 25 carbon atoms or an aromatic hydrocarbon group having 6 to 12 carbon atoms, wherein a part or all of hydrogen atoms included in these groups are unsubstituted or substituted; and k6 and k7 are each independently an integer of 0 to 5, wherein in a case where each of $R^{b6}$, $R^{b7}$, $R^R$ and $R^S$ is present a plurality of number, a plurality of $R^{b6}$s, $R^{b7}$s, $R^R$s and $R^S$s are each identical or different.

Examples of the alkyl group represented by $R^{b1}$ to $R^{b7}$ include a methyl group, an ethyl group, a n-propyl group, an i-propyl group, a n-butyl group, an i-butyl group, a sec-butyl group, a t-butyl group, and the like.

Examples of the aromatic hydrocarbon group represented by $R^{b1}$ to $R^{b3}$, $R^{b6}$ or $R^{b7}$ include aryl groups such as a phenyl group, a tolyl group, a xylyl group, a mesityl group and a naphthyl group; aralkyl groups such as a benzyl group and a phenethyl group; and the like.

Examples of the unsubstituted aromatic hydrocarbon group represented by $R^{b4}$ or $R^{b5}$ include a phenyl group, a tolyl group, a benzyl group, and the like.

Examples of the substituent which may substitute for the hydrogen atom included in the alkyl group, the alicyclic hydrocarbon group or the aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, halogen atoms are preferred, and a fluorine atom is more preferred.

$R^{b1}$ to $R^{b7}$ represent preferably an unsubstituted alkyl group, a fluorinated alkyl group, an unsubstituted monovalent aromatic hydrocarbon group, —OSO₂—$R^{bb}$, or —SO₂—$R^{bb}$, more preferably a fluorinated alkyl group, or an unsubstituted monovalent aromatic hydrocarbon group, and still more preferably a fluorinated alkyl group, wherein $R^{bb}$ represents an unsubstituted monovalent alicyclic hydrocarbon group or an unsubstituted monovalent aromatic hydrocarbon group.

In the above formula (X-1), k1, k2 and k3 are an integer of preferably 0 to 2, more preferably 0 or 1, and still more preferably 0.

In the above formula (X-2): k4 is an integer of preferably 0 to 2, more preferably 0 or 1, and still more preferably 1; and k5 is an integer of preferably 0 to 2, more preferably 0 or 1, and still more preferably 0.

In the above formula (X-3), k6 and k7 are an integer of preferably 0 to 2, more preferably 0 or 1, and still more preferably 0.

$X^+$ is preferably a cation represented by the above formula (X-1), and more preferably a triphenylsulfonium cation.

The acid generating agent represented by the above formula (2-2) is exemplified by compounds (2-2-1) to (2-2-14) represented by the following formulae (2-2-1) to (2-2-14), and the like.

(2-2-1)
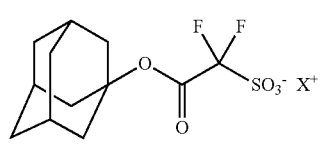

(2-2-2)
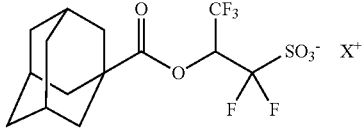

(2-2-3)
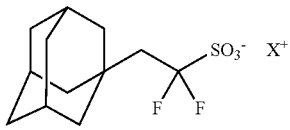

(2-2-4)
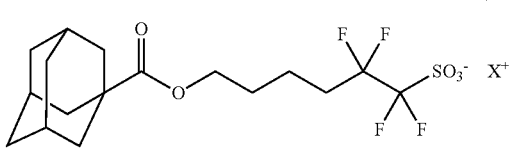

(2-2-5)
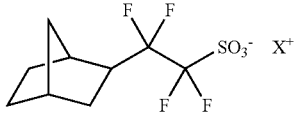

(2-2-6)
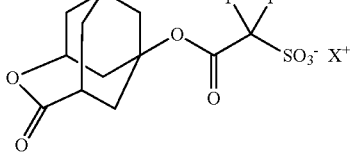

(2-2-7)
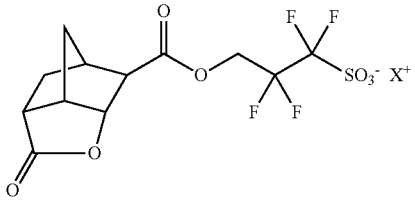

(2-2-8)
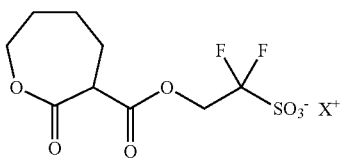

(2-2-9)
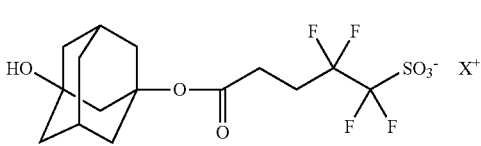

(2-2-10)
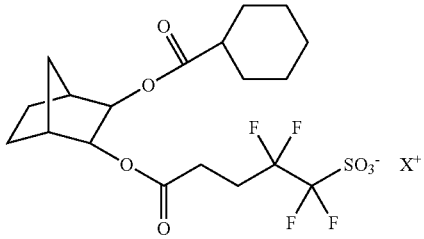

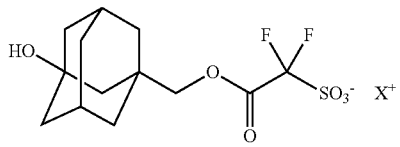
(2-2-11)

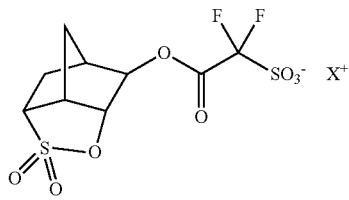
(2-2-12)

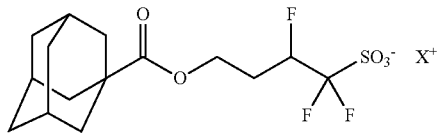
(2-2-13)

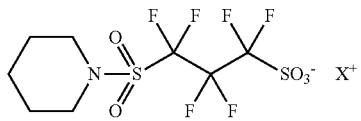
(2-2-14)

Of these, the acid generating agent (B) is preferably an onium salt compound, more preferably a sulfonium salt or an iodonium salt, and still more preferably a compound (2-2-1), a compound (2-2-5), a compound (2-2-13), a compound (2-2-14), or di(t-butylphenyl)iodonium nonafluorobutanesulfonate.

In the case where the acid generator (B) is the acid generating agent (B), the content of the acid generator (B) with respect to 100 parts by mass of the block copolymer (A) is, in light of ensuring the sensitivity and developability of the composition for pattern formation, preferably no less than 10 parts by mass and no greater than 90 parts by mass, more preferably no less than 20 parts by mass and no greater than 80 parts by mass, still more preferably no less than 25 parts by mass and no greater than 70 parts by mass, and particularly preferably no less than 30 parts by mass and no greater than 65 parts by mass. When the content of the acid generating agent (B) falls within the above range, the phase separation ability of the resulting directed self-assembling film and the rectangularity of the cross-sectional shape of a pattern may be further improved. One, or two or more types of the acid generator (B) may be used.

(C) Solvent

The composition for pattern formation typically contains (C) a solvent. Examples of the solvent (C) include similar solvents to those exemplified in connection with the synthesis method of the block copolymer (A), as well as alcohols such as methanol, ethanol, 1-propanol, 2-propanol and 4-methyl-2-pentanol, and the like. Of these, propylene glycol monomethyl ether acetate is preferred. It is to be noted that these solvents may be used alone, or two or more types thereof may be used in combination.

Surfactant

The composition for pattern formation may further contain a surfactant. When the composition for pattern formation contains the surfactant, coating properties to the substrate and the like can be improved.

Preparation Method of Composition for Pattern Formation

The composition for pattern formation may be prepared, for example, by mixing the block copolymer (A), the surfactant and the like at a certain ratio in the solvent (C). Alternatively, the composition for pattern formation may be prepared in a state in which the composition for pattern formation has been dissolved or dispersed in an appropriate solvent, and may be put the solution into use.

Pattern-Forming Method

The pattern-forming method according to another embodiment of the present invention principally includes the steps of: providing a first film directly or indirectly on a substrate by using the composition for pattern formation according to the embodiment of the present invention (hereinafter, may be also referred to as "first film-providing step"); exposing the first film (hereinafter, may be also referred to as "first film exposure step"); providing on the first film, a second film that is a directed self-assembling film having a phase separation structure (hereinafter, may be also referred to as "second film-providing step"); and removing a part of a plurality of phases of the second film.

Moreover, the pattern-forming method according to the another embodiment of the present invention includes a method that includes the steps of: providing a first film that is a directed self-assembling film having a phase separation structure, directly or indirectly on a substrate by using the composition for pattern formation according to the embodiment of the present invention; exposing the first film; and removing a part of a plurality of phases of the first film (hereinafter, may be also referred to as "first film-partially removing step"). The latter method preferably further includes the steps of forming on the first film, a second film that is a directed self-assembling film having a phase separation structure; and removing a part of a plurality of phases of the second film (hereinafter, may be also referred to as "second film-partially removing step").

Further, it is preferred that the pattern-forming method according to the another embodiment of the present invention further includes the step of forming a prepattern directly or indirectly on a substrate (hereinafter, may be also referred to as "prepattern-forming step"), and that the first film or the second film which is a directed self-assembling film is provided directly or indirectly on a region compartmentalized by the prepattern on the substrate.

In addition, the pattern-forming method according to the another embodiment of the present invention preferably further includes after the directed self-assembling film-providing step, the steps of: removing the prepattern (hereinafter, may be also referred to as "prepattern-removing step"); and etching the substrate using a pattern as a mask (hereinafter, may be also referred to as "substrate pattern-forming step"). Hereinafter, each step is explained with reference to FIGS. 1 to 6.

In the pattern-forming method shown in FIGS. 1 to 6, the first film is a directed self-assembling film, and the first film-providing step, the first film exposure step, the prepattern-forming step, the second film-providing step, the first film-partially removing step and the second film-partially removing step are executed in this order. In this embodiment, the first film corresponds to an underlayer film, and the second film corresponds to a directed self-assembling film formed on the underlayer film. It is to be noted that the first film-partially removing step and the second film-partially removing step may be executed concurrently.

First Film-Providing Step

In this step, a first film 102 is formed on a substrate 101 using the composition for pattern formation according to the embodiment of the present invention. Thus, as shown in FIG. 1, a substrate having an underlayer film can be obtained which includes the first film 102 formed on the substrate 101.

The composition for pattern formation contains the block copolymer (A) that includes two or more types of blocks, and the block copolymer (A) is capable of forming a phase separation structure through directed self-assembly. Accordingly, applying the composition for pattern formation on the substrate, followed by annealing or the like allows blocks having the same property to be assembled in the first film 102 and to spontaneously form an ordered pattern, and thus enables directed self-assembly, as generally referred to, to be accelerated.

As the substrate 101, for example, a conventionally well-known substrate, e.g., a silicon wafer, a wafer coated with aluminum, or the like may be used.

Figure 2:
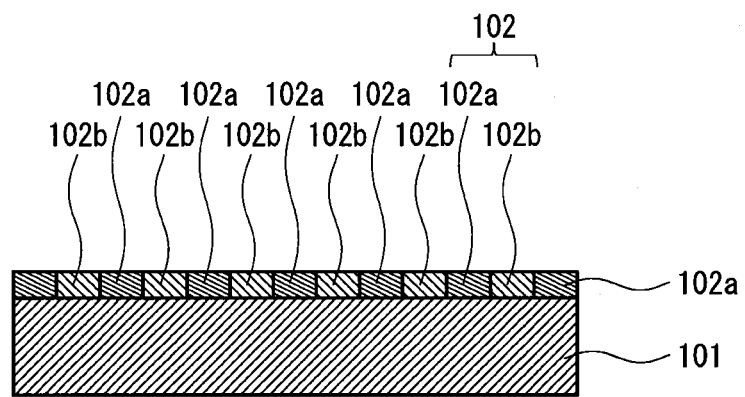
FIG. 2 shows a schematic view illustrating one example of a state after causing phase separation of the underlayer film in the pattern-forming method according to the embodiment of the present invention.

Although the procedure for forming the first film 102 is not particularly limited, the first film 102 may be formed by, for example, curing through heating or the like, a coating film which had been provided by an application according to a well-known procedure such as a spin coating procedure on the substrate 101. Moreover, the heating or the like allows phase separation to occur in the first film 102, whereby phases 102a formed from a (meth)acrylic acid ester block and phases 102b formed from a styrene block are formed, as shown in FIG. 2.

Although the heating temperature is not particularly limited, the heating temperature is preferably no less than 90° C. and no greater than 550° C., more preferably no less than 90° C. and no greater than 450° C., and still more preferably no less than 90° C. and no greater than 300° C. The time period of the heating is preferably no less than 2 min and no greater than 20 min, and more preferably no less than 5 min and no greater than 15 min. When the heating temperature and the time period of the heating each fall within the above range, the phase separation structure of the first film 102 as described above is made more favorable.

Although the film thickness of the first film 102 is not particularly limited, the film thickness of the first film 102 is preferably no less than 50 nm and no greater than 20,000 nm, and more preferably no less than 70 nm and no greater than 1,000 nm. In addition, the first film 102 preferably includes an SOC (Spin on carbon) film.

First Film Exposure Step

In this step, the first film 102 is exposed to generate an acid from the acid generator (B) in the first film 102, whereby the first labile group and/or the second labile group in the first film 102 is/are dissociated. The radioactive ray employed in the exposure is exemplified by visible light rays, ultraviolet rays, far ultraviolet rays, X-rays, electron beams, γ-rays, molecular beams, ion beams, and the like.

Moreover, further heating (post exposure baking; hereinafter, may be also referred to as "PEB") is preferably executed after the exposure of the first film 102. The heating allows the dissociation of the first labile group and the like as described above to be further accelerated. The heating temperature is preferably no less than 50° C. and no greater than 150° C., and more preferably no less than 80° C. and no greater than 120° C. In addition, the time period of the heating is preferably no less than 30 sec and no greater than 120 sec, and more preferably no less than 45 sec and no greater than 90 sec.

Prepattern-Forming Step

Figure 3:
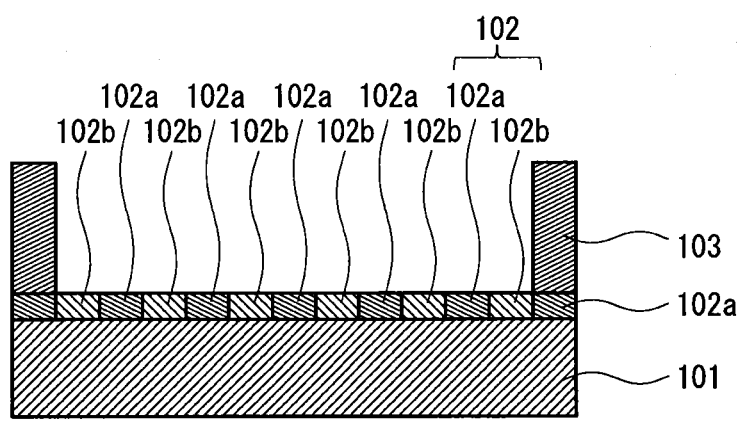
FIG. 3 shows a schematic view illustrating one example of a state after forming a prepattern on the underlayer film in the pattern-forming method according to the embodiment of the present invention.

In this step, a prepattern 103 is formed on the first film 102 using a composition for prepattern formation, as shown in FIG. 3. The prepattern 103 controls a pattern configuration reflecting the phase separation structure of a second film 105, and consequently a desired fine pattern can be formed. More specifically, among the blocks included in a block copolymer contained in a composition for forming the second film 105, blocks having a higher affinity to a lateral face of the prepattern 103 form phases along the prepattern, whereas blocks having a lower affinity form phases at positions away from the prepattern 103. Accordingly, a desired pattern can be formed. In addition, according to the material, size, shape, etc. of the prepattern 103, the structure of the pattern formed through phase separation of the second film 105 can be minutely controlled. It is to be noted that the prepattern 103 may be appropriately selected depending on the pattern intended to be finally formed, and, for example, a line-and-space pattern, a hole pattern, and the like may be employed.

As the method for forming the prepattern 103, those similar to well-known resist pattern-forming methods may be employed. In addition, a conventional composition for resist film formation may be used as the composition for forming the prepattern 103.

In a specific method for forming the prepattern 103, for example, commercially available chemical amplification resist composition is applied on the first film 102 to provide a resist film. Next, an exposure is carried out by irradiating a desired region of the resist film with a radioactive ray through a mask having a specific pattern. Examples of the radioactive ray include ultraviolet rays, far ultraviolet rays, X-rays, charged particle rays, and the like. Of these, far ultraviolet rays typified by ArF excimer laser beams and KrF excimer laser beams are preferred, and ArF excimer laser beams are more preferred. Also, the exposure may employ a liquid immersion medium. Subsequently, PEB is carried out, followed by development using a developer solution such as an alkaline developer solution or an organic solvent, whereby a desired prepattern 103 can be formed.

It is to be noted that the surface of the prepattern 103 may be subjected to a hydrophobilization treatment or a hydrophilization treatment. In specific treatment methods, a hydrogenation treatment including exposing to hydrogen plasma for a certain time period, and the like may be adopted. An increase of the hydrophobicity or hydrophilicity of the surface of the prepattern 103 enables the directed self-assembly of the second film 105 to be accelerated.

Second Film-Providing Step

In this step, the second film 105 having a phase separation structure is formed on the substrate using a composition for directed self-assembling film formation. In a case where the prepattern 103 is not used, the composition for directed self-assembling film formation is applied directly on the first film 102 to provide a coating film, followed by annealing or the like to form the second film 105 having a phase separation structure.

Since the second film 105 is formed from the composition for directed self-assembling film formation, a phase separation structure can be formed through the directed self-assembly described above, similarly to the first film 102. In addition, due to the second film 105 being provided on the first film 102, the phase separation structure (microdomain structure) included in the second film 105 is altered by not only an interaction between the blocks of the block copolymer contained in the composition for directed self-assembling film formation, but also an interaction with the first film 102; therefore, the structure of the second film 105 may be easily controlled, whereby a desired pattern can be obtained. Furthermore, when the second film is thin, a transfer process thereof can be improved owing to having the first film 102.

The composition for pattern formation according to the embodiment of the present invention is preferably used as the composition for directed self-assembling film formation, although a well-known composition which allows for directed self-assembly may be used. In this step, when the composition for pattern formation according to the embodiment of the present invention is used, the phase separation of the second film 105 occurs more easily, whereby a finer phase separation structure (microdomain structure) can be formed.

Figure 4:
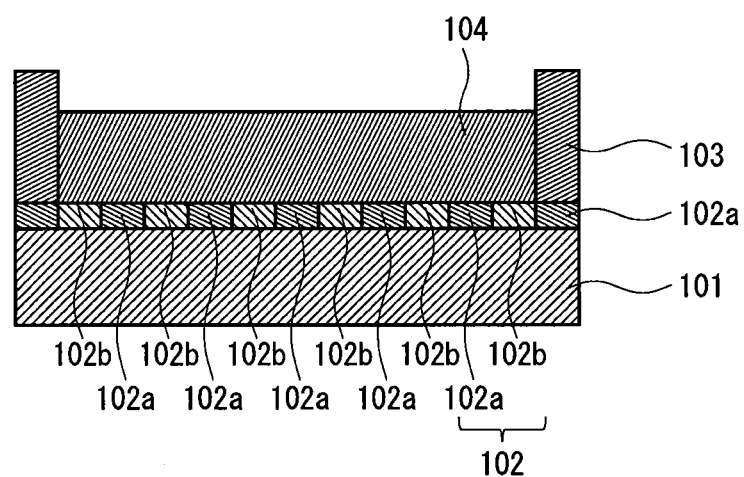
FIG. 4 shows a schematic view illustrating one example of a state after applying a composition for pattern formation on a region compartmentalized by the prepattern on the underlayer film in the pattern-forming method according to the embodiment of the present invention.
Figure 5:
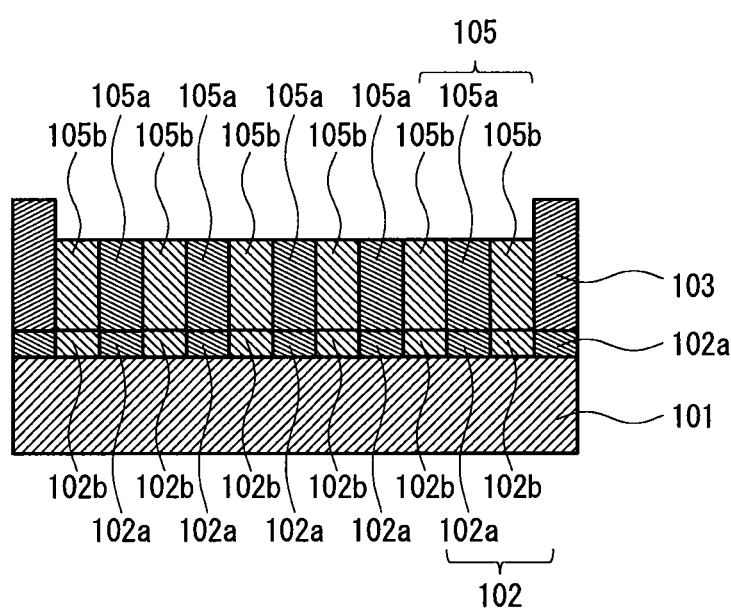
FIG. 5 shows a schematic view illustrating one example of a state after forming a directed self-assembling film on a region compartmentalized by the prepattern on the underlayer film in the pattern-forming method according to the embodiment of the present invention.

Alternatively, in a case where the prepattern 103 is formed, the composition for directed self-assembling film formation is applied on a region surrounded by the prepattern 103 on the first film 102 to provide a coating film 104, as shown in FIGS. 4 and 5. Thereafter, annealing, etc., of the coating film 104 allows the second film 105 having a phase separation structure to be formed, which includes phase boundaries substantially perpendicular to the substrate 101.

In this case, the phase separation structure of the second film 105 is preferably formed along the prepattern 103, and the boundaries formed by the phase separation are more preferably substantially parallel to a lateral face of the prepattern 103. For example, in a case where the prepattern 103 has a higher affinity to the styrene block of the block copolymer, a phase 105b formed from the styrene block is linearly formed along the prepattern 103, and adjacent to the phase 105b, a phase 105a formed from the (meth)acrylic acid ester block is arranged, and subsequently, the phase 105b and the phase 105a are alternately arranged in this order to form a lamellar phase separation structure, or the like. It is to be noted that the phase separation structure formed in this step is configured with a plurality of phases, and the boundaries formed by these phases are, in general, substantially perpendicular; however, the boundaries per se may not necessarily be clear. In addition, the resultant phase separation structure can be more strictly controlled by way of a ratio of the length of each block chain (a styrene block chain, a (meth)acrylic acid ester block chain, etc.) in molecules of the block copolymer, the length of the molecule of the block copolymer, the prepattern 103, the first film 102 and the like, and thus, a desired fine pattern can be obtained.

Although the procedure for applying the composition for directed self-assembling film formation on a substrate to provide the coating film 104 is not particularly limited, for example, a procedure in which the composition for directed self-assembling film formation is applied by spin coating, etc., and the like may be involved. Accordingly, a space between facing walls of the prepattern 103 on the first film 102 is filled with the composition for directed self-assembling film formation.

The annealing process may include, for example, heating in an oven, on a hot plate, etc. The annealing temperature is typically no less than 80° C. and no greater than 400° C., and preferably no less than 100° C. and no greater than 300° C. In addition, the annealing time period is typically no less than 1 min and no greater than 120 min, and preferably no less than 5 min and no greater than 90 min.

The film thickness of the second film 105 is preferably no less than 0.1 nm and no greater than 500 nm, and more preferably no less than 0.5 nm and no greater than 100 nm.

First Film-Partially Removing Step, and Second Film-Partially Removing Step

Figure 6:
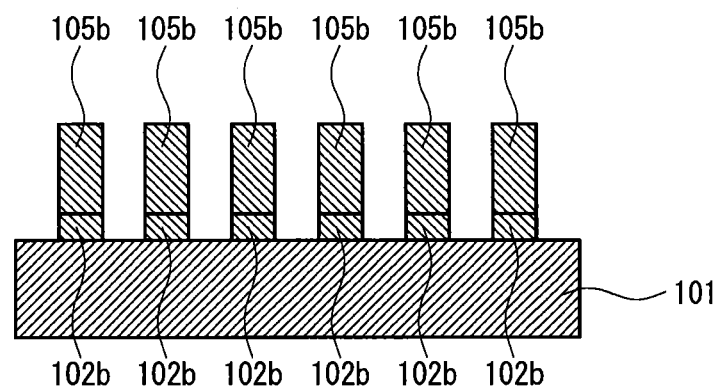
FIG. 6 shows a schematic view illustrating one example of a state after removing a part of a plurality of phases of the directed self-assembling film, a part of a plurality of phases of the underlayer film and the prepattern in the pattern-forming method according to the embodiment of the present invention.

In this step, as shown in FIGS. 5 and 6, 105a and 102a, i.e., a part of a plurality of phases of the phase separation structure included in the second film 105 and the first film 102 are removed. Using the difference in the etching rate between the phases formed through phase separation by directed self-assembly, the phases 105a and 102a formed from the (meth)acrylic acid ester block of the second film 105 and first film 102 can be removed by an etching treatment. A state after removing the phases 105a and 102a formed from the (meth)acrylic acid ester block as well as the prepattern 103 is shown in FIG. 6. It is to be noted that prior to the etching treatment, irradiation with a radioactive ray may be conducted as needed. As the radioactive ray, in a case where the phases to be removed by etching are the phases formed from the (meth)acrylic acid ester block, a radioactive ray of 254 nm may be used. The irradiation with the radioactive ray results in decomposition of the phases formed from the (meth)acrylic acid ester block, whereby the etching can be facilitated.

As the procedure for removing the phases 102a and 105a formed from the (meth)acrylic acid ester block, well-known procedures e.g., reactive ion etching (RIE) such as chemical dry etching and chemical wet etching; physical etching such as sputter etching and ion beam etching; and the like may be exemplified. Of these, RIE is preferred, and chemical dry etching carried out by using a $CF_4$ gas, an $O_2$ gas or the like, and chemical wet etching (wet development) carried out by using an etching solution, i.e., an organic solvent, or a liquid such as hydrofluoric acid are more preferred.

Examples of the organic solvent include: alkanes such as n-pentane, n-hexane and n-heptane; cycloalkanes such as cyclohexane, cycloheptane and cyclooctane; saturated carboxylic acid esters such as ethyl acetate, n-butyl acetate, i-butyl acetate and methyl propionate; ketones such as acetone, 2-butanone, 4-methyl-2-pentanone and 2-heptanone; alcohols such as methanol, ethanol, 1-propanol, 2-propanol and 4-methyl-2-pentanol; and the like. It is to be noted that these solvents may be used either alone, or two or more types thereof may be used in combination.

Prepattern-Removing Step

In this step, the prepattern 103 is removed, as shown in FIGS. 5 and 6. Removal of the prepattern 103 enables a finer and complicated pattern to be formed. It is to be noted that respect to the procedure for removing the prepattern 103, a procedure similar to that in the removal of the phases 105a and 102a formed from the (meth)acrylic acid ester block in the first film-partially removing step and second film-partially removing step may be employed. This step may be carried out concomitantly with the first film-partially removing step or the second film-partially removing step, or may be carried out before or after these steps.

Substrate Pattern-Forming Step

In this step, using as a mask, a pattern constituted with residual phases 105b and 102b formed from the styrene block after the partially removing step(s), the substrate is etched to permit patterning. After completion of the patterning onto the substrate, the phases used as a mask are removed from the substrate by a dissolving treatment or the like, whereby a patterned substrate (pattern) can be finally obtained.

As the procedure for the etching, a procedure similar to that in the partially removing step(s) may be employed, and the etching gas and the etching solution may be appropriately selected in accordance with the materials of the substrate. For example, in a case where the substrate is a silicon material, a gas mixture of a chlorofluorocarbon-containing gas and $SF_4$, or the like may be used. Alternatively, in a case where the substrate is a metal film, a gas mixture of $BCl_3$ and $Cl_2$, or the like may be used.

In the pattern-forming method, as an alternative to the method shown in FIGS. 1 to 6, only the first film that is a directed self-assembling film may be formed on the substrate. Moreover, after a typical underlayer film is formed on the substrate, the first film that is a directed self-assembling film may be formed on the underlayer film. Even in these cases, superior phase separation ability and rectangularity of the cross-sectional shape are exhibited owing to the first film formed by using the composition for pattern formation according to the embodiment of the present invention.

Furthermore, in the pattern-forming method, a first film not having a phase separation structure may be formed using the composition for pattern formation according to the embodiment of the present invention, and a second film having a phase separation structure may be formed on the first film by using a composition for directed self-assembling film formation. Even in this case, since the first film is formed using the composition for pattern formation, which exhibits the increased contrast of the polarity between the blocks, the second film exhibits superior phase separation ability and leads to superior rectangularity of the cross-sectional shape.

As described above, owing to superior phase separation ability, the pattern obtained by the pattern-forming method according to the another embodiment of the present invention exhibits superior rectangularity of the cross-sectional shape thereof. Accordingly, the pattern is suitably used for semiconductor elements and the like, and further the semiconductor elements are widely used for light emitting diodes (LEDs), solar cells and the like.

EXAMPLES

Hereinafter, the present invention is explained in detail by way of Examples, but the present invention is not in any way limited to these Examples. Measuring methods of physical properties are shown below.

Weight Average Molecular Weight (Mw) and Number Average Molecular Weight (Mn)

The Mw and the Mn of the polymer were determined by gel permeation chromatography (GPC) using GPC columns (G2000HXL×2, G3000HXL×1, and G4000HXL×1) manufactured by Tosoh Corporation, under the following condition:
eluent: tetrahydrofuran (Wako Pure Chemical Industries, Ltd.);
flow rate: 1.0 mL/min;
sample concentration: 1.0% by mass;
amount of injected sample: 100 μL;
detector: differential refractometer; and
standard substance: mono-dispersed polystyrene.

Synthesis of Block Copolymer (A)

Monomers used in the synthesis of the block copolymer (A) are shown below.

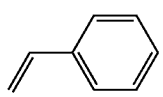
(M-1)

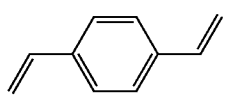
(M-2)

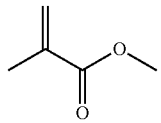
(M-3)

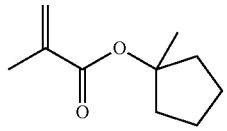
(M-4)

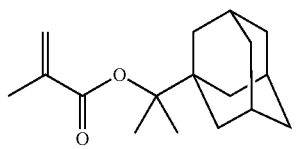
(M-5)

It is to be noted that the compound (M-1) gives the structural unit (I), the compound (M-2) gives the structural unit (I-a), the compound (M-3) gives the structural unit (II), and the compounds (M-4) and (M-5) give the structural unit (II-b).

Synthesis Example 1

Synthesis of Block Copolymer (A-1)

After a 500 mL flask as a reaction vessel was dried under reduced pressure, 200 g of tetrahydrofuran, which had been subjected to a dehydrating treatment by distillation, was charged into the flask under a nitrogen atmosphere, and cooled to −78° C. Thereafter, 1.09 mL (0.98 mmol) of a 1 N solution of sec-butyllithium (sec-BuLi) in cyclohexane was charged, and 10.5 g (0.101 mol) of the compound (M-1), which had been subjected to a dehydrating treatment by distillation, was added dropwise over 30 min. During this dropwise addition, the internal temperature of the reaction solution was carefully adjusted so as not to be −60° C. or higher. After the completion of the dropwise addition, the mixture was aged for 30 min. Then, 3.91 mL (1.96 mmol) of a 0.5 N solution of lithium chloride in tetrahydrofuran and 0.42 mL (2.94 mmol) of diphenylethylene were added thereto, and the mixture was sufficiently stirred. To this, 10.1 g (0.101 mol) of the compound (M-3) and 0.07 g (0.0004 mol) of the compound (M-4), both of which had been subjected to a dehydrating treatment by distillation, were added dropwise over 30 min, and the mixture was aged for 120 min. A dry carbon dioxide gas was bubbled into this solution to terminate the polymerization.

Then, to the solution obtained after the termination of the polymerization end was added a mixed liquid of 1.56 g (3 mol % with respect to the carboxyl group at the end of the main chain of the block copolymer) of phosphoric acid 2-ethylhexyl ester and 2 g (0.232 mmol) of propyl vinyl ether, which had been dried by dehydration, under heating to reflux at 60° C., and transformation of the end of the main chain of the block copolymer to a hemiacetal ester (hereinafter, may be also referred to as "hemiacetalization") was carried out for 3 hrs. Thereafter, precipitation was permitted in methanol, and then the solvent was distilled off. The white solid obtained after distilling the solvent off was diluted with methyl isobutyl ketone to give a concentration of 10% by mass. Then, 500 g of a 0.5% by mass aqueous oxalic acid solution was charged with stirring, the mixture was left to stand, and then the underlayer, i.e., the water layer, was discarded. This operation was repeated three times to remove the lithium salt. Then, 500 g of ultra pure water was charged with stirring, and then the underlayer, i.e., the water layer, was discarded. This operation was repeated three times to remove oxalic acid. Thereafter, the solution was concentrated, and then the concentrated solution was added dropwise to 2,000 g of methanol to precipitate a polymer. The resin obtained after vacuum filtration was washed twice with methanol, and then dried at 60° C. under reduced pressure to obtain 18.8 g of a block copolymer (A-1) as a white solid (yield: 91%). The block copolymer (A-1) had an Mw of 36,700, an Mn of 34,200 and an Mw/Mn of 1.07.

The synthesis method of the block copolymer (A-1) in Synthesis Example 1 is represented by the following scheme.

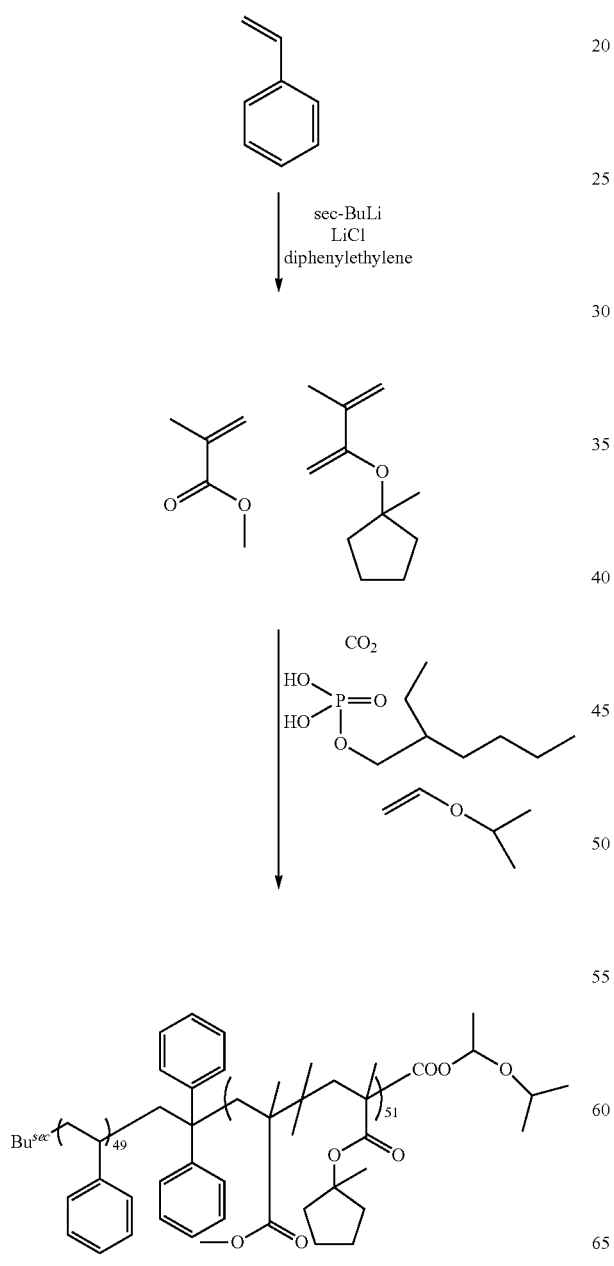

Synthesis Examples 2 and 3

Synthesis of Block Copolymers (A-2) and (A-3)

Block copolymers (A-2) and (A-3) were synthesized in a similar manner to Synthesis Example 1 except that the type and the amount of the compound used in the polymerization were as shown in Table 1.

Synthesis Example 4

Synthesis of Block Copolymer (A-4)

A block copolymer (A-4) was synthesized in a similar manner to Synthesis Example 1 except that: 1.09 mL (0.98 mmol) of a 1 N solution of potassium tert-butoxide in tetrahydrofuran was used in place of the 1 N solution of sec-butyllithium (sec-BuLi) in cyclohexane; 1.16 g (0.98 mmol) of α-methylstyrene, which had been subjected to a dehydrating treatment by distillation, was used; and the type and the amount of the compound used in the polymerization were as shown in Table 1.

The synthesis method of the block copolymer (A-4) in Synthesis Example 4 is represented by the following scheme.

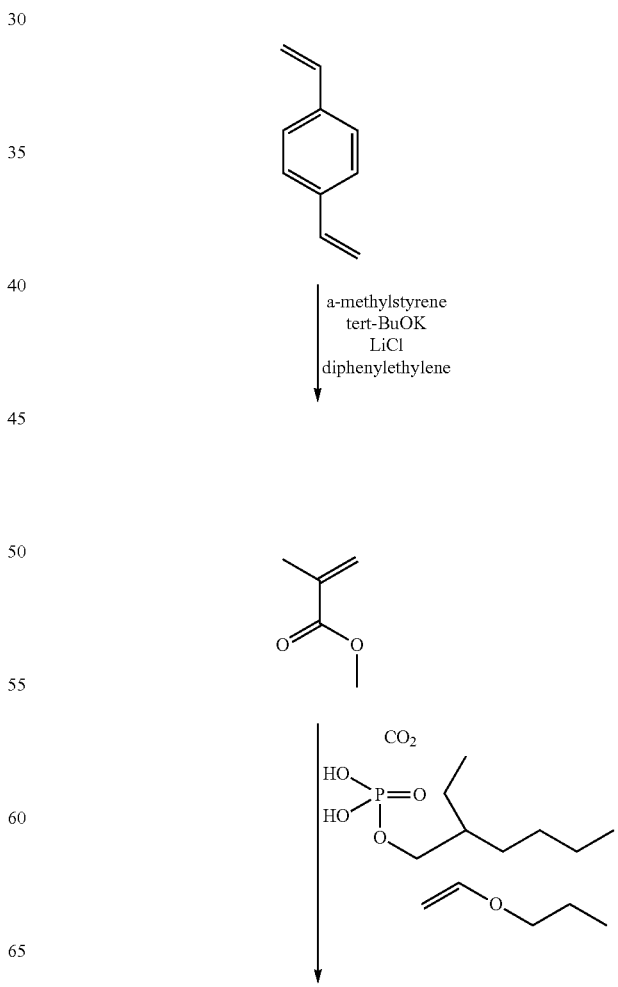

-continued

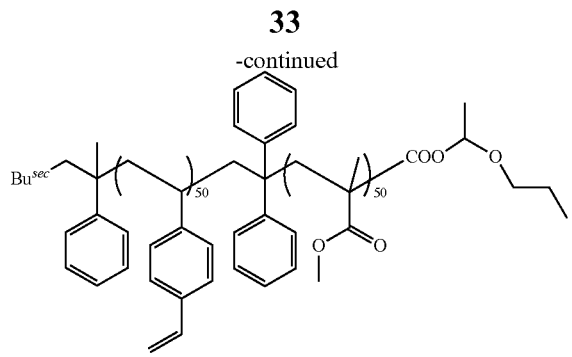

Synthesis Examples 5 and 7

Synthesis of Block Copolymers (CA-1) and (CA-3)

Block copolymers (CA-1) and (CA-3) were synthesized in a similar manner to Synthesis Example 1 except that: the type and the amount of the compound used in the polymerization were as shown in Table 1; methanol was used in the termination of the polymerization in place of the carbon dioxide gas; and the hemiacetalization of the polymerization end was not carried out.

Synthesis Example 6

Synthesis of Block Copolymer (CA-2)

A block copolymer (CA-2) was synthesized in a similar manner to Synthesis Example 1 except that: the type and the amount of the compound used in the polymerization were as shown in Table 1; the hemiacetalization of the polymerization end was not carried out; and a mixed liquid of 95 parts by mass of hexane and 5 parts by mass of toluene was used in place of methanol in the precipitation of the polymer and the washing of the resin after the removal of oxalic acid.

Synthesis Example 8

Synthesis of Block Copolymer (CA-4)

A block copolymer (CA-4) was synthesized in a similar manner to Synthesis Example 4 except that: the type and the amount of the compound used in the polymerization were as shown in Table 1; methanol was used in the termination of the polymerization in place of the carbon dioxide gas; and the hemiacetalization of the polymerization end was not carried out.

The main chain end of the second block, the yield, the Mn and the Mw/Mn of the block copolymers (A–1) to (A–4) and (CA-1) to (CA-4) are shown together in Table 1.

TABLE 1

| | Block copolymer | Monomer that gives first block type | amount (% by mole) | Monomer that gives second block type | amount (% by mole) | Main chain end of second block | Yield (%) | Mn | Mw/Mn |
|---|---|---|---|---|---|---|---|---|---|
| Synthesis Example 1 | A-1 | M-1 | 49 | M-3 M-4 | 49 2 | hemiacetal ester | 91 | 34,200 | 1.07 |
| Synthesis Example 2 | A-2 | M-1 | 49 | M-3 M-5 | 49 2 | hemiacetal ester | 92 | 35,200 | 1.07 |
| Synthesis Example 3 | A-3 | M-1 | 50 | M-3 | 50 | hemiacetal ester | 90 | 35,500 | 1.06 |
| Synthesis Example 4 | A-4 | M-2 | 50 | M-3 | 50 | hemiacetal ester | 91 | 34,200 | 1.07 |
| Synthesis Example 5 | CA-1 | M-1 | 50 | M-3 | 50 | H | 97 | 36,500 | 1.03 |
| Synthesis Example 6 | CA-2 | M-1 | 50 | M-3 | 50 | COOH | 92 | 35,500 | 1.09 |
| Synthesis Example 7 | CA-3 | M-1 | 50 | M-4 | 50 | H | 96 | 36,500 | 1.08 |
| Synthesis Example 8 | CA-4 | M-2 | 50 | M-3 | 50 | H | 95 | 36,000 | 1.06 |

Preparation of Compositions for Pattern Formation

The compounds used in the preparation of the composition for pattern formation are shown below.

(B) Acid Generator

B-1: a compound represented by the following formula (B-1)

B-2: a compound represented by the following formula (B-2)

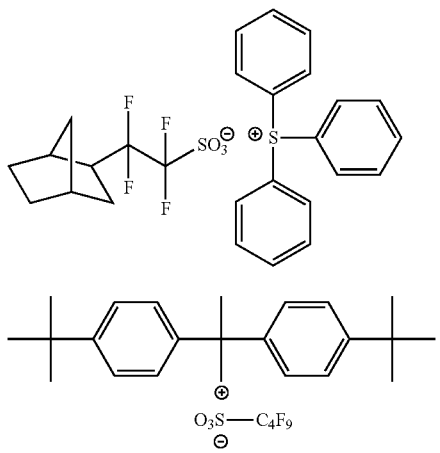

(B-1)

(B-2)

(C) Solvent

C-1: propylene glycol monomethyl ether acetate

Examples 1 to 8 and Comparative Examples 1 to 5

Preparation of Composition for Underlayer Film Formation

Ten parts by mass of (A-1) as the block copolymer (A) and 5 parts by mass of (B-1) as the acid generator (B) were dissolved in 1,000 parts by mass of (C-1) as the solvent (C). This solution was filtered through a membrane filter having a pore size of 200 nm to prepare a composition for underlayer film formation (S-1). Compositions for underlayer film formation (S-2) to (S-6) and (CS-1) to (CS-4) were prepared in a similar manner by using the polymer and the like shown in Table 2.

Preparation of Compositions for Directed Self-Assembling Film Formation

A composition for directed self-assembling film formation (CT-1) was prepared by dissolving 10 parts by mass of the block copolymer (CA-1) in 1,000 parts by mass of (C-1) as the solvent (C), followed by filtration through a membrane filter having a pore size of 200 nm. Compositions for directed self-assembling film formation (CT-2), (CT-3), (T-1) and (T-2) were prepared in a similar manner by using the polymer and the like shown in Table 3.

TABLE 3

| | Composition for directed self-assembling film formation | Block copolymer type | content (parts by mass) | (C) Solvent type | content (parts by mass) |
|---|---|---|---|---|---|
| Example 1 | CT-1 | CA-1 | 10 | C-1 | 1,000 |
| Example 2 | CT-1 | CA-1 | 10 | C-1 | 1,000 |
| Example 3 | CT-1 | CA-1 | 10 | C-1 | 1,000 |
| Example 4 | CT-1 | CA-1 | 10 | C-1 | 1,000 |
| Example 5 | CT-2 | CA-4 | 10 | C-1 | 1,000 |
| Example 6 | CT-2 | CA-4 | 10 | C-1 | 1,000 |
| Example 7 | T-1 | A-1 | 10 | C-1 | 1,000 |
| Example 8 | T-2 | A-3 | 10 | C-1 | 1,000 |
| Comparative Example 1 | CT-1 | CA-1 | 10 | C-1 | 1,000 |
| Comparative Example 2 | CT-2 | CA-4 | 10 | C-1 | 1,000 |
| Comparative Example 3 | CT-1 | CA-1 | 10 | C-1 | 1,000 |
| Comparative Example 4 | CT-3 | CA-2 | 10 | C-1 | 1,000 |
| Comparative Example 5 | CT-3 | CA-2 | 10 | C-1 | 1,000 |

Forming-method of Underlayer Film and Directed Self-Assembling Film

Each composition for underlayer film formation shown in Table 2 was applied on a 12-inch silicon wafer using a spin coater ("CLEAN TRACK ACT12", available from Tokyo Electron Limited) to provide a coating film having a film

TABLE 2

| | Composition for underlayer film formation | Block copolymer type | content (parts by mass) | (B) Acid generating agent type | content (parts by mass) | (C) Solvent type | content (parts by mass) |
|---|---|---|---|---|---|---|---|
| Example 1 | S-1 | A-1 | 10 | B-1 | 5 | C-1 | 1,000 |
| Example 2 | S-2 | A-2 | 10 | B-1 | 5 | C-1 | 1,000 |
| Example 3 | S-3 | A-3 | 10 | B-1 | 5 | C-1 | 1,000 |
| Example 4 | S-4 | A-4 | 10 | B-1 | 5 | C-1 | 1,000 |
| Example 5 | S-5 | A-3 | 10 | B-2 | 5 | C-1 | 1,000 |
| Example 6 | S-6 | A-4 | 10 | B-2 | 5 | C-1 | 1,000 |
| Example 7 | S-1 | A-1 | 10 | B-1 | 5 | C-1 | 1,000 |
| Example 8 | S-3 | A-3 | 10 | B-1 | 5 | C-1 | 1,000 |
| Comparative Example 1 | CS-1 | CA-1 | 10 | B-1 | 5 | C-1 | 1,000 |
| Comparative Example 2 | CS-2 | CA-2 | 10 | B-1 | 5 | C-1 | 1,000 |
| Comparative Example 3 | CS-3 | CA-3 | 10 | B-1 | 5 | C-1 | 1,000 |
| Comparative Example 4 | CS-2 | CA-2 | 10 | B-1 | 5 | C-1 | 1,000 |
| Comparative Example 5 | CS-4 | CA-2 | 10 | — | — | C-1 | 1,000 | thickness of 30 nm, and this coating film was heated at 210° C. for 10 min to permit phase separation. Thereafter, the entire surface of this coating film was exposed using an ArF Immersion Scanner ("NSR S610C", available from NIKON Corporation), and then PEB was carried out at 100° C. for 60 sec, whereby an underlayer film having a phase separation structure was obtained.

Next, each composition for directed self-assembling film formation shown in Table 3 was applied onto the underlayer film so as to have a thickness of 30 nm, and heated at 210° C. for 10 min, whereby a microdomain structure was formed. Subsequently, dry etching with $O_2$ plasma using a plasma etching apparatus ("Tactras", available from Tokyo Electron Limited) was carried out to form a pattern with a 25-nm pitch.

Evaluations

Each of the patterns according to Examples and Comparative Examples was observed using a line-width measurement SEM ("S-4800", available from Hitachi, Ltd.). Evaluation methods are shown below.

Pattern Width

The width of each pattern was measured at arbitrary five points, and an average of the five measurements was calculated and designated as pattern width. The pattern width is shown in Table 4.

Pattern Configuration

The cross-sectional shape of each pattern described above was observed, and the evaluation was made as: "A" when the pattern did not exhibit a tailing shape, but was rectangular; and "B" when tailing was found. The results of the evaluations are shown in Table 4.

TABLE 4

|   | Pattern width (nm) | Pattern configuration |
|---|---|---|
| Example 1 | 25 | A |
| Example 2 | 25 | A |
| Example 3 | 25 | A |
| Example 4 | 25 | A |
| Example 5 | 25 | A |
| Example 6 | 25 | A |
| Example 7 | 25 | A |
| Example 8 | 25 | A |
| Comparative Example 1 | 26 | B |
| Comparative Example 2 | 30 | B |
| Comparative Example 3 | 30 | B |
| Comparative Example 4 | 33 | B |
| Comparative Example 5 | 31 | B |

As shown in Table 4, when the compositions for pattern formation according to Examples were used, the patterns had a narrower width, indicating superior phase separation ability. Furthermore, the cross-sectional shape of the pattern was rectangular. On the other hand, with respect to the compositions for pattern formation according to Comparative Examples, the pattern had a wider width, indicating inferior phase separation ability. Also, inferior rectangularity of the cross-sectional shape of the pattern according to Comparative Examples was exhibited.

Moreover, Examples 7 and 8 in which the composition for pattern formation according to the embodiment of the present invention was used for forming a directed self-assembling film gave results which were comparable to those of Examples 1 to 6 in which other composition for pattern formation was used for forming a directed self-assembling film. Therefore, it is found that the composition for pattern formation according to the embodiment of the present invention can suitably be used not only for forming an underlayer film, but also for forming a directed self-assembling film.

The composition for pattern formation and the pattern-forming method according to the embodiments of the present invention enable a directed self-assembling film that is superior in phase separation ability and leads to superior rectangularity of the cross-sectional shape of a pattern to be obtained. Therefore, these can be suitably used for pattern formation in manufacture of semiconductor devices, and the like in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A composition, comprising:
a block copolymer that comprises a first acid labile group at an end of a main chain of the block copolymer, the first acid labile group being capable of being dissociated by an acid or heat; and
a solvent,
wherein the first acid labile group is a carboxy protecting group with which a hydrogen atom of a carboxy group is substituted, a hydroxyl protecting group with which a hydrogen atom of a hydroxy group is substituted, or both thereof,
the carboxy protecting group is at least one protecting group selected from the group consisting of a trialkyl-silyl group, a 1-alkoxyalkyl group, a cyclic ether, and an alkyl group having a quaternary carbon atom represented by formula (i), and
the hydroxy protecting group is at least one protecting group selected from the group consisting of a group forming an acetal structure, and an acyl group:

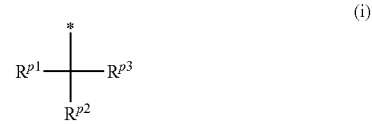

(i)

wherein $R^{p1}$ represents a monovalent hydrocarbon group having 1 to 20 carbon atoms; $R^{p2}$ and $R^{p3}$ each independently represent a monovalent chain hydrocarbon group having 1 to 20 carbon atoms or a monovalent alicyclic hydrocarbon group having 3 to 20 carbon atoms, or $R^{p2}$ and $R^{p3}$ taken together represent an alicyclic structure having 3 to 20 ring atoms together with the carbon atom to which $R^{p2}$ and $R^{p3}$ bond; and
* denotes a binding site to an oxygen atom of the carboxy group.

2. The composition according to claim 1, further comprising an acid generator that generates an acid upon application of an energy.

3. The composition according to claim 1, wherein the block copolymer is capable of forming a phase separation structure through directed self-assembly.

4. The composition according to claim 1, wherein the first acid labile group is represented by formula (a):

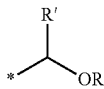
(a)

wherein in the formula (a),
R represents a monovalent organic group having 1 to 20 carbon atoms;
R' represents a hydrogen atom or a monovalent organic group having 1 to 20 carbon atoms; and
* denotes a binding site to an atom at the end of the main chain of the block copolymer.

5. The composition according to claim 1, wherein the block copolymer comprises:
a first block that comprises a first structural unit comprising a styrene structure; and
a second block that comprises a second structural unit comprising a (meth)acrylic acid ester structure.

6. The composition according to claim 5, wherein the first acid labile group is present at an end of a main chain of the second block.

7. The composition according to claim 5, wherein the block copolymer comprises a crosslinkable structural unit that comprises a crosslinkable group on a side chain thereof.

8. The composition according to claim 7, wherein the first block comprises the crosslinkable structural unit.

9. The composition according to claim 5, wherein the block copolymer further comprises a second acid labile group on a side chain of the block copolymer, the second acid labile group being capable of being dissociated by an acid or heat.

10. The composition according to claim 9, wherein the second block comprises the second acid labile group.

11. A pattern-forming method comprising:
applying a composition directly or indirectly on a substrate to provide a first film;
exposing the first film;
providing a second film on the first film, the second film being a directed self-assembling film comprising a phase separation structure which comprises a plurality of phases; and
removing a part of the plurality of phases of the second film,
wherein the composition comprises:
a block copolymer that comprises a first acid labile group at an end of a main chain of the block copolymer, the first acid labile group being capable of being dissociated by an acid or heat; and
a solvent.

12. The pattern-forming method according to claim 11, further comprising:
forming a prepattern directly or indirectly on the substrate,
wherein the second film is provided after forming the prepattern.

13. The pattern-forming method according to claim 11, wherein a line-and-space pattern or a hole pattern is formed.

14. The pattern-forming method according to claim 11, wherein the first acid labile group is a carboxy protecting group with which a hydrogen atom of a carboxy group is substituted, a hydroxyl protecting group with which a hydrogen atom of a hydroxy group is substituted, or both thereof,
the carboxy protecting group is at least one protecting group selected from the group consisting of a trialkylsilyl group, a 1-alkoxyalkyl group, a cyclic ether, and an alkyl group having a quaternary carbon atom represented by formula (i), and
the hydroxy protecting group is at least one protecting group selected from the group consisting of a group forming an acetal structure, and an acyl group:

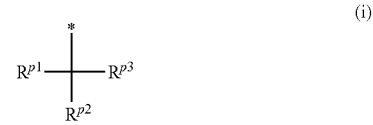
(i)

wherein $R^{p1}$ represents a monovalent hydrocarbon group having 1 to 20 carbon atoms; $R^{p2}$ and $R^{p3}$ each independently represent a monovalent chain hydrocarbon group having 1 to 20 carbon atoms or a monovalent alicyclic hydrocarbon group having 3 to 20 carbon atoms, or $R^{p2}$ and $R^{p3}$ taken together represent an alicyclic structure having 3 to 20 ring atoms together with the carbon atom to which $R^{p2}$ and $R^{p3}$ bond; and
* denotes a binding site to an oxygen atom of the carboxy group.

15. A pattern-forming method comprising:
applying a composition directly or indirectly on a substrate to provide a first film that is a directed self-assembling film comprising a phase separation structure which comprises a plurality of phases;
exposing the first film; and
removing a part of the plurality of phases of the first film,
wherein the composition comprises:
a block copolymer that comprises a first acid labile group at an end of a main chain of the block copolymer, the first acid labile group being capable of being dissociated by an acid or heat; and
a solvent, and
wherein the block copolymer is capable of forming a phase separation structure through directed self-assembly.

16. The pattern-forming method according to claim 15, further comprising:
providing a second film on the first film, the second film being a directed self-assembling film comprising a phase separation structure which comprises a plurality of phases; and
removing a part of the plurality of phases of the second film.

17. The pattern-forming method according to claim 15, further comprising:
forming a prepattern directly or indirectly on the substrate,
wherein the first film is provided after forming the prepattern.

18. The pattern-forming method according to claim 15, wherein a line-and-space pattern or a hole pattern is formed.

19. The pattern-forming method according to claim 15, wherein the first acid labile group is a carboxy protecting group with which a hydrogen atom of a carboxy group is substituted, a hydroxyl protecting group with which a hydrogen atom of a hydroxy group is substituted, or both thereof,
the carboxy protecting group is at least one protecting group selected from the group consisting of a trialkylsilyl group, a 1-alkoxyalkyl group, a cyclic ether, and an alkyl group having a quaternary carbon atom represented by formula (i), and
the hydroxy protecting group is at least one protecting group selected from the group consisting of a group forming an acetal structure, and an acyl group:

wherein $R^{p1}$ represents a monovalent hydrocarbon group having 1 to 20 carbon atoms; $R^{p2}$ and $R^{p3}$ each independently represent a monovalent chain hydrocarbon group having 1 to 20 carbon atoms or a monovalent alicyclic hydrocarbon group having 3 to 20 carbon atoms, or $R^{p2}$ and $R^{p3}$ taken together represent an alicyclic structure having 3 to 20 ring atoms together with the carbon atom to which $R^{p2}$ and $R^{p3}$ bond; and
* denotes a binding site to an oxygen atom of the carboxy group.

* * * * *